(12) United States Patent
Chen et al.

(10) Patent No.: US 12,272,722 B2
(45) Date of Patent: Apr. 8, 2025

(54) METHOD FOR MANUFACTURING DISPLAY DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 370 days.

(21) Appl. No.: 17/683,364

(22) Filed: Mar. 1, 2022

(65) Prior Publication Data
US 2022/0320177 A1    Oct. 6, 2022

(30) Foreign Application Priority Data

Mar. 31, 2021    (CN) .......................... 202110350950.7

(51) Int. Cl.
| H01L 27/15 | (2006.01) |
| H01L 33/00 | (2010.01) |
| H01L 33/50 | (2010.01) |
| H01L 33/58 | (2010.01) |

(52) U.S. Cl.
CPC ........ *H01L 27/156* (2013.01); *H01L 33/0095* (2013.01); *H01L 33/50* (2013.01); *H01L 33/58* (2013.01); *H01L 2933/0041* (2013.01); *H01L 2933/0058* (2013.01)

(58) Field of Classification Search
CPC ... H01L 27/156; H01L 33/0095; H01L 33/50; H01L 33/58; H01L 2933/0041; H01L 2933/0058; H01L 25/167; H01L 33/504; H01L 33/505; G09F 9/33
See application file for complete search history.

(56) References Cited

U.S. PATENT DOCUMENTS

| 11,018,089 | B2 | 5/2021 | Chen | |
| 2010/0117997 | A1* | 5/2010 | Haase | ..................... H01L 33/28 |
| | | | | 313/1 |
| 2019/0285944 | A1 | 9/2019 | Liu | |
| 2021/0074770 | A1* | 3/2021 | Choe | .................... G02B 5/0242 |
| 2021/0083152 | A1* | 3/2021 | Biebersdorf | .......... H01L 33/405 |

FOREIGN PATENT DOCUMENTS

| CN | 110620127 | 12/2019 |
| CN | 111415955 | 7/2020 |
| CN | 111708213 | 9/2020 |

\* cited by examiner

*Primary Examiner* — Jonathan Han
(74) *Attorney, Agent, or Firm* — Winston Hsu

(57) ABSTRACT

The present disclosure provides a method for manufacturing a display device. The method includes providing a light emitting module, providing a driving module, providing a light conversion module, and assembling the light emitting module, the driving module, and the light conversion module to form a display assembly. The light emitting module is disposed between the light conversion module and the driving module.

8 Claims, 20 Drawing Sheets

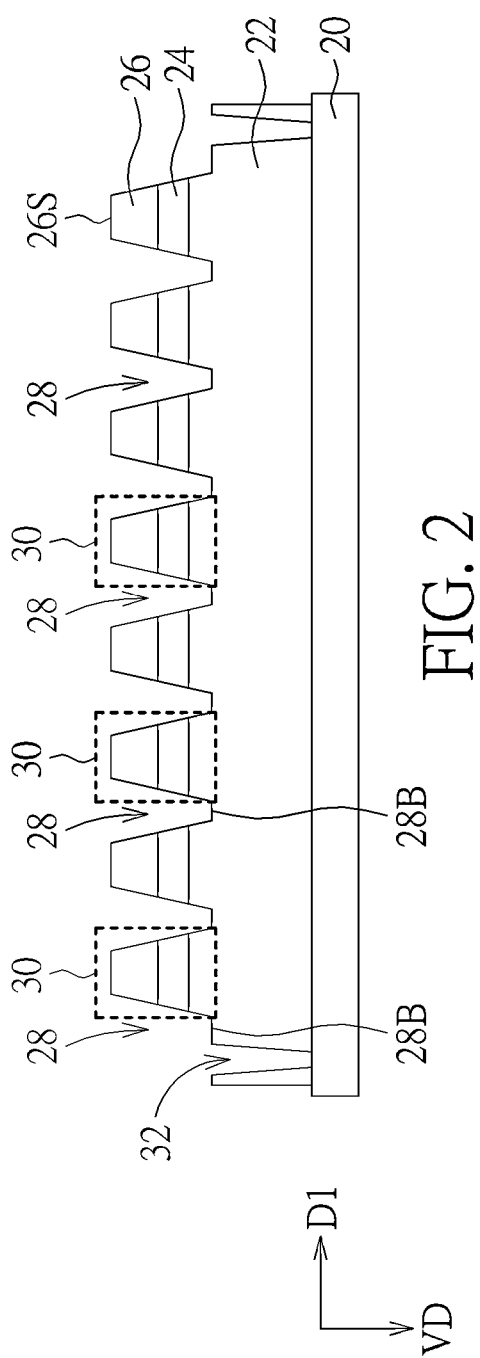
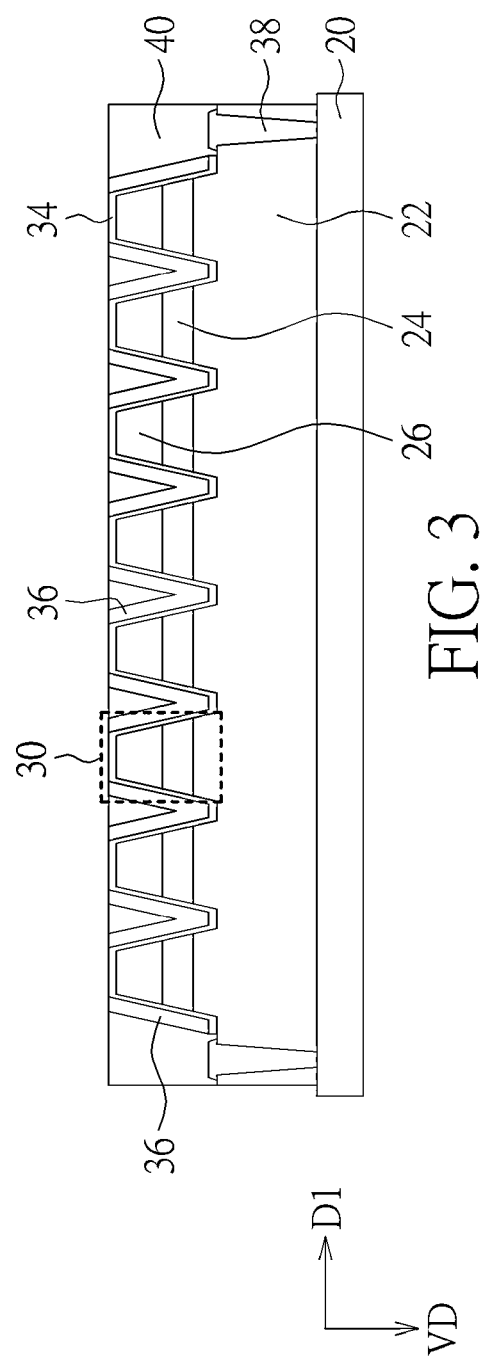
FIG. 2
FIG. 3

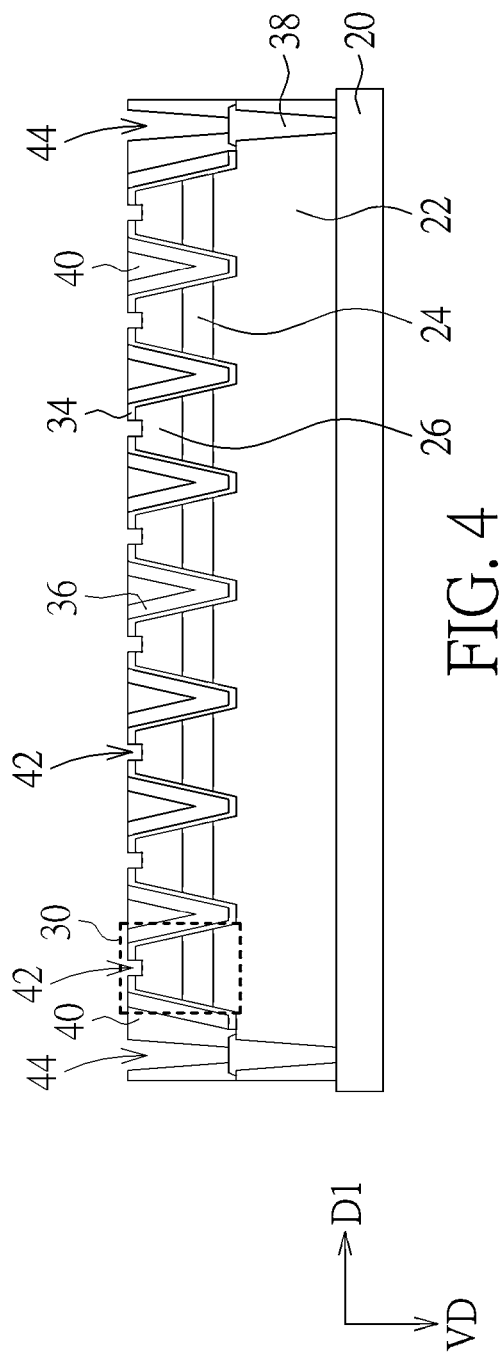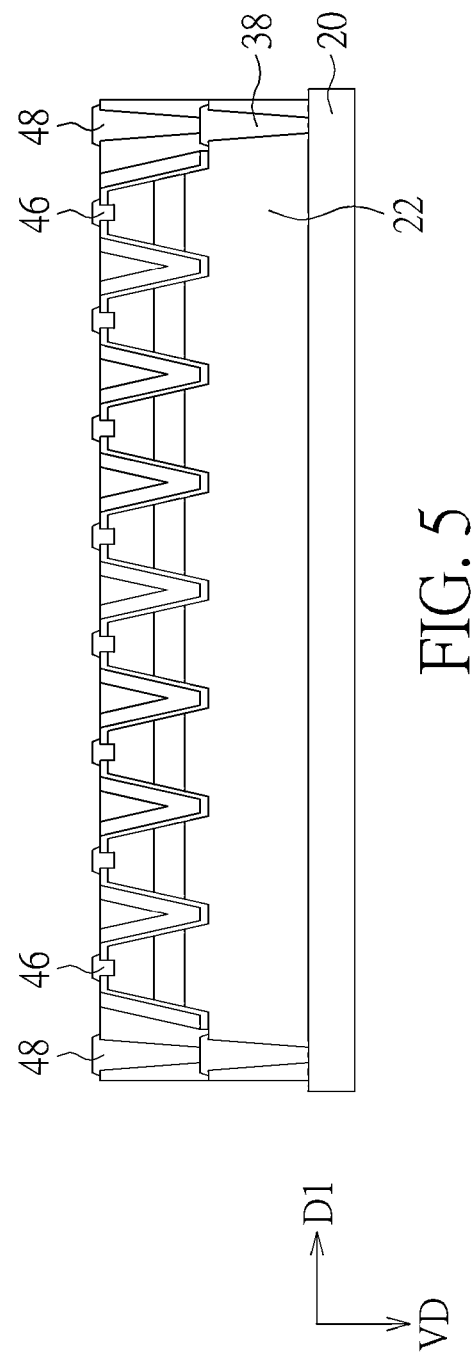

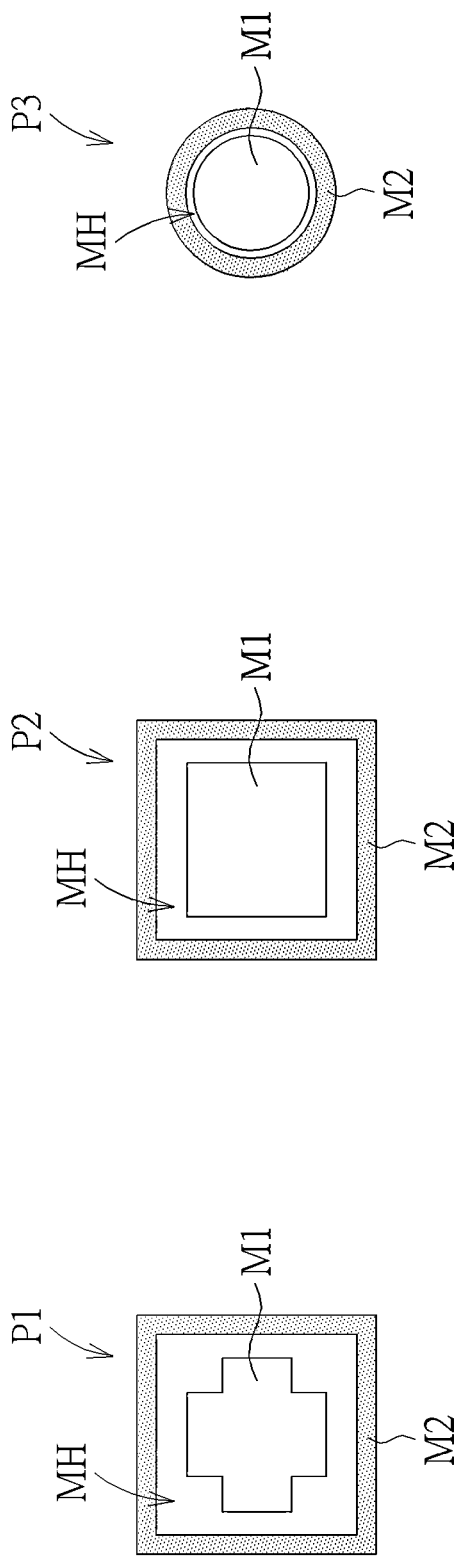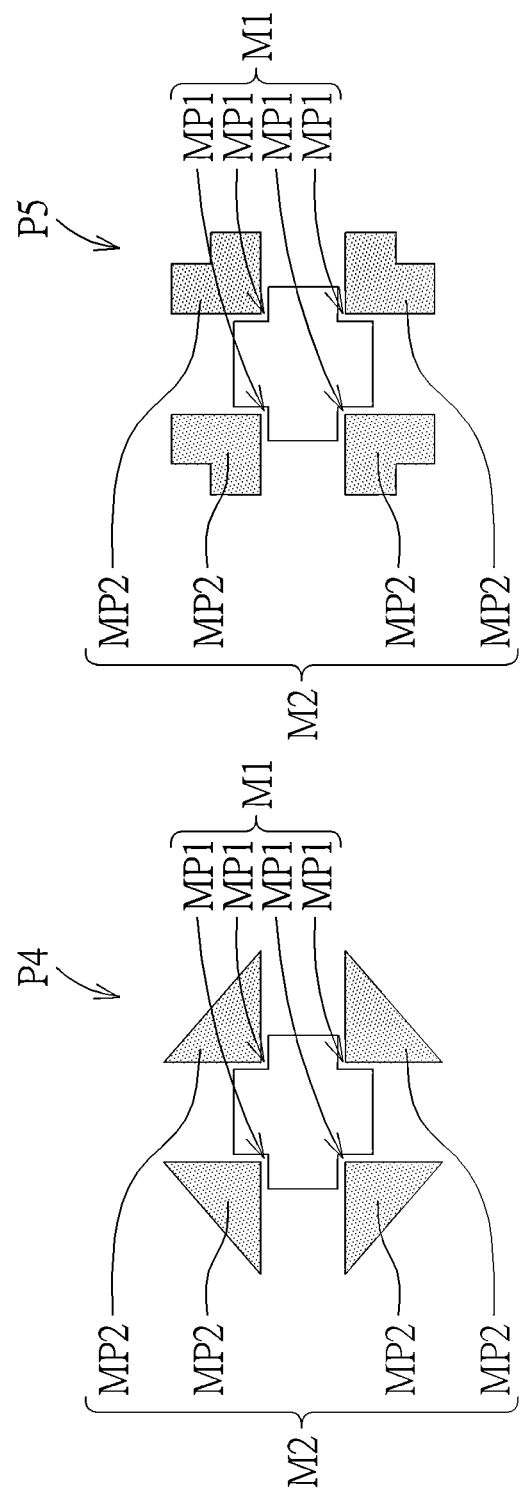
FIG. 22

METHOD FOR MANUFACTURING DISPLAY DEVICE

CROSS REFERENCE TO RELATED APPLICATION

This application claims the benefit of Chinese Patent Application Serial No. 202110350950.7, filed Mar. 31, 2021, the entire content of which is incorporated herein by reference.

BACKGROUND OF THE DISCLOSURE

1. Field of the Disclosure

The present disclosure relates to a method for manufacturing a display device.

2. Description of the Prior Art

With the development of technology, higher and higher resolutions of display devices are required, so that elements in the display devices (such as light emitting diodes) have developed towards miniaturization, for example, micro-elements are transferred to a substrate by mass-transfer technique. However, in the mass-transfer technique, as the resolution of the display device is improved, each micro-element cannot be disposed in one sub-pixel due to limited space, and the micro-element is not easily transferred to the substrate of small size in the mass-transfer technique, so that the resolution cannot be further improved and the application of the display device is limited. Therefore, it is necessary for those skilled in the related art to develop novel manufacturing methods.

SUMMARY OF THE DISCLOSURE

An embodiment of the present disclosure provides a method for manufacturing a display device. The method includes providing a light emitting module; providing a driving module; providing a light conversion module; and assembling the light emitting module, the driving module, and the light conversion module to form a display assembly. The light emitting module is disposed between the light conversion module and the driving module.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 to FIG. 7 schematically illustrate the method for providing the light emitting module according to some embodiments of the present disclosure.

FIG. 22 schematically illustrates a top view pattern of the alignment mark groups according to some embodiments of the present disclosure.

DETAILED DESCRIPTION

Figure 1:
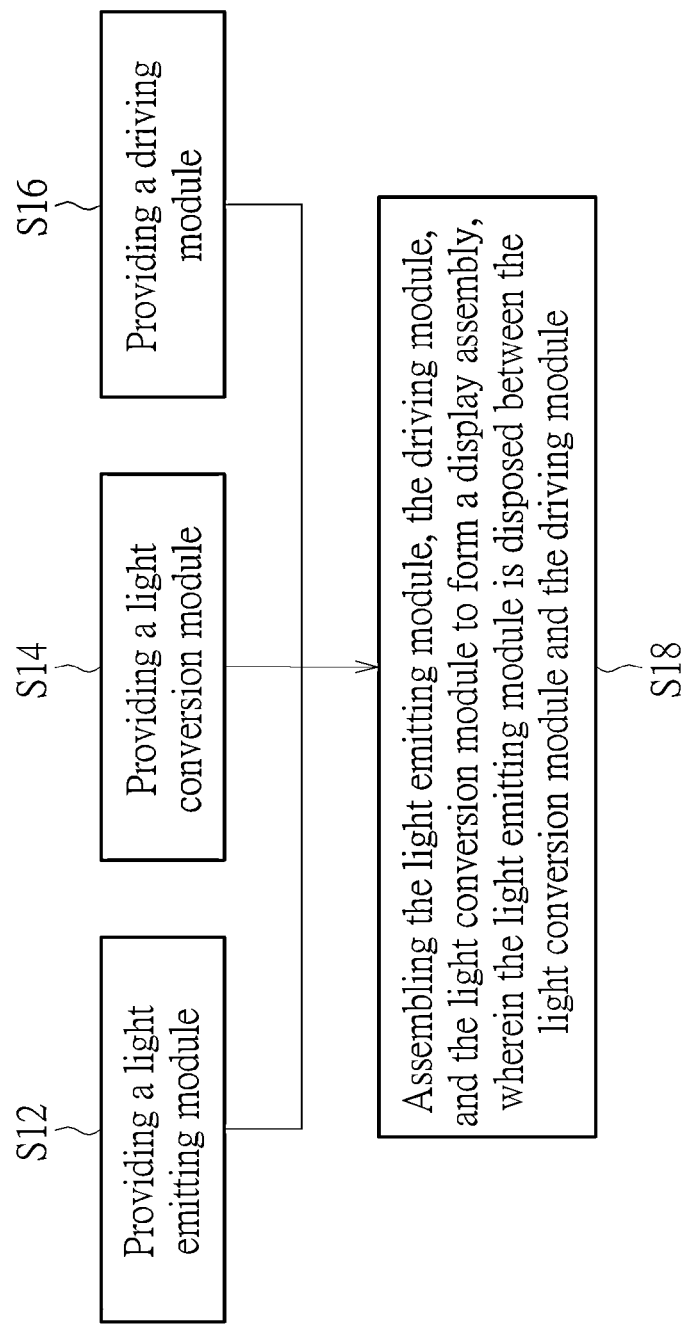
FIG. 1 schematically illustrates a flowchart of a method for manufacturing a display device according to some embodiments of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence of a manufacturing method. These ordinal numbers are just used to make a claimed element with a certain name be clearly distinguishable from another claimed element with the same name.

Spatially relative terms, such as "above", "on", "beneath", "below", "under", "left", "right", "before", "front", "after", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way. Furthermore, when one element or layer is "on" another element or layer, or is connected to another element or layer, it can be understood that the element or layer may be directly on the another element or layer, or may be directly connected to the another element or layer, and alternatively another element or layer may be between the one element or layer and the another element or layer (indirectly). On the contrary, when the element or layer is "directly on" the another element or layer or is "directly connected to" the another element or layer, there is no intervening element or layer between the element or layer and the another element or layer.

In addition, when a feature is described as "on" or "above" another feature, the two features may be in contact with each other. Alternatively, one or more other element may be disposed between the two features, and in such situation, the two features may not be in contact with each other.

As disclosed herein, the terms "approximately", "about", and "substantially" generally mean within 10%, 5%, 3%, 2%, 1%, or 0.5% of a given value or range. The quantity disclosed herein is an approximate quantity, that is, without a specific description of "approximately", "about", "substantially", the quantity may still include the meaning of "approximately", "about", and "substantially". In addition, the term "in a range from a first numerical value to a second numerical value" means that the range includes the first numerical value, the second numerical value, and other numerical values therebetween.

It should be understood that according to the following embodiments, features of different embodiments may be replaced, recombined or mixed to constitute other embodiments without departing from the spirit of the present disclosure. The features of various embodiments may be mixed arbitrarily and used indifferent embodiments without departing from the spirit of the present disclosure or conflicting.

In the present disclosure, the length and the width may be measured by using an optical microscope. The thickness may also be obtained by measuring the cross-sectional image in an electron microscope, but not limited thereto. In addition, there may be a certain error in any two values or directions used for comparison. If a first value is equal to a second value, it implies that there may be an error of about 10% between the first value and the second value. If a first direction is perpendicular to a second direction, the angle between the first direction and the second direction may be between 80 degrees and 100 degrees. If a first direction is parallel to a second direction, the angle between the first direction and the second direction may be between 0 degrees and 10 degrees.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, the display device may have a display function and may optionally include a sensing function, a touching sensing function, an antenna function, other suitable functions or any combination thereof, but not limited thereto. In some embodiments, the display device may include tiled device, but not limited thereto. The display device may include liquid crystal molecule, an organic light emitting diode (OLED), an inorganic light emitting diode (e.g., a micro or mini light emitting diode (micro-LED, mini-LED), quantum dots material, quantum dot light emitting diode (e.g., QLED, QDLED), a fluorescent material, a phosphor material, other suitable materials, or any combination thereof, but not limited thereto. In addition, the display device may be a color display device or a single color display device. The appearance of the display devices may be rectangular, circular, polygonal, a shape with curved edges, curved or other suitable shapes, but not limited thereto. The display devices described in the following contents are color display devices having light emitting diode (e.g., the organic light emitting diode, the inorganic light emitting diode or quantum dot light emitting diode) as an example for illustrative description, but the display devices of the present disclosure are not limited thereto. The display device may have peripheral systems such as a driving system, a control system, a light source system, a shelf system, etc., to support the display device.

FIG. 1 schematically illustrates a flowchart of a method for manufacturing a display device according to some embodiments of the present disclosure. As shown in FIG. 1, the method for manufacturing the display device provided by some embodiments of the present disclosure may include step a S12 to a step S18. In the step S12, a light emitting module (e.g., but not limited to a light emitting module 12 shown in FIG. 7) may be provided. In the step S14, a light conversion module (e.g., but not limited to a light conversion module 14 shown in FIG. 10, FIG. 11 or FIG. 12) may be provided. In the step S16, a driving module (e.g., but not limited to a driving module 16 shown in FIG. 14) may be provided. Since the step S12, the step S14 and the step S16 do not affect each other, the step S12, the step S14 and the step S16 may be performed at the same time, any two of them may be performed at the same time and before or after the other one of them, or they may be performed in any arrangement order of the step S12, the step S14 and the step S16, but not limited thereto. In some embodiments, another step may be performed before, after or between any two of the step S12, the step S14 and the step S16, or at the same time as any one of the step S12, the step S14 and the step S16.

After the step S12, the step S14 and the step S16 are completed, the step S18 may be performed to assemble the light emitting module, the driving module and the light conversion module to form a display assembly (e.g., but not limited to a display assembly 18 shown in FIG. 14 or FIG. 21), in which the light emitting module is disposed between the light conversion module and the driving module.

Hereinafter, the step S12 of providing the light emitting module shown in FIG. 1 will be described in detail with reference to FIG. 2 to FIG. 7, but not limited thereto. FIG. 2 to FIG. 7 schematically illustrate the method for providing the light emitting module according to some embodiments of the present disclosure. As shown in FIG. 2, a first semiconductor layer 22, a light emitting layer 24 and a second semiconductor layer 26 sequentially stacked may be formed on a carrier 20. The method for forming the first semiconductor layer 22, the light emitting layer 24, and the second semiconductor layer 26 may include, for example, an epitaxial process or other suitable semiconductor processes. The first semiconductor layer 22 may have a first conductivity type, and the second semiconductor layer 26 may have a second conductivity type different from the first conductivity type. For example, the first conductivity type and the second conductivity type may be N-type and P-type, respectively. In some embodiments, the first conductivity type and the second conductivity type may be P-type and N-type, respectively. The first semiconductor layer 22 and the second semiconductor layer 26 may, for example, include gallium nitride (GaN) or other suitable semiconductor materials. The light emitting layer 24 may, for example, include a multiple quantum well (MQW), in which the multiple quantum well may, for example, include indium gallium nitride (InGaN)/gallium nitride or other suitable materials. The carrier 20 may include, for example, sapphire or other suitable supporting materials.

In the embodiment of FIG. 2, after the first semiconductor layer 22, the light emitting layer 24, and the second semiconductor layer 26 are formed, a patterning process may be performed on a surface 26S of the second semiconductor layer 26 away from the light emitting layer 24 to form a trench 28. The trench 28 may penetrate the second semiconductor layer 26 and the light emitting layer 24, and extend into the first semiconductor layer 22. While viewed along a top view direction VD perpendicular to an upper surface of the carrier 20, the trench 28 may surround a plurality of light emitting diode islands 30 and separate the light emitting diode islands 30 from each other. Each light emitting diode island 30 may include a part of the first semiconductor layer 22, a part of the light emitting layer 24, and a part of the second semiconductor layer 26 stacked in sequence. FIG. 2 shows a cross-sectional view of the formed light emitting diode islands 30 and the trench 28 along a direction D1, so that a plurality of trenches 28 shown in FIG. 2 respectively represent different parts of the trench 28 located at different positions. In some embodiments, after the first semiconductor layer 22, the light emitting layer 24, and the second semiconductor layer 26 are formed, the carrier 20 is turned upside down. At this time, the first semiconductor layer 22 and the second semiconductor layer 26 are also turned upside down and disposed on another carrier (not shown), such that the first semiconductor layer 22 is disposed on the second semiconductor layer 26. In such case, the formed trench 28 may penetrate the first semiconductor layer 22 and the light emitting layer 24 (e.g. from a surface 22S of the first semiconductor layer 22 shown in FIG. 6). In some embodiments, the patterning process may include, for example, photolithography and etching processes, but not limited thereto.

As shown in FIG. 2, at the same time as forming the trench 28 or after the trench 28 is formed, at least one through hole 32 may be formed in the first semiconductor layer 22 at a bottom 28B of the trench 28 to penetrate the first semiconductor layer 22. In some embodiments, the through hole 32 may be located below the outermost part of the trench 28 shown in FIG. 2 or below the part of the trench 28 between two adjacent light emitting diode islands 30.

As shown in FIG. 3, after the through hole 32 is formed, a first insulating layer 34 may be formed on the exposed first semiconductor layer 22 and the exposed light emitting diode islands 30, for example, by a deposition process, and then the first insulating layer 34 located in the through hole 32 and at the bottom 28B of the part of the trench 28 corresponding to the through hole 32 may be removed to expose the through hole 32 and the carrier 20, for example, by a patterning process. After that, a conductive layer may be formed on the first insulating layer 34, the exposed through hole 32, and the exposed carrier 20, and the conductive layer extends into the through hole 32. Next, the conductive layer may be patterned to form a reflective element 36 on sidewalls of the light emitting diode islands 30, and a connecting element 38 in the through hole 32, in which the first insulating layer 34 is disposed between the reflective element 36 and the light emitting diode islands 30. By means of the reflective element 36 formed on the sidewalls of the light emitting diode islands 30, light generated from light emitting units formed in the following steps (e.g., light emitting unit 58 shown in FIG. 7) may be gathered and be emitted toward the light conversion module. In some embodiments, the reflective element 36 and the connecting element 38 may, for example, include a metal material. For instance, the metal material may include aluminum, silver, gold, copper, or other suitable materials. In some embodiments, a part of the connecting element 38 may extend to the bottom of the trench 28, but not limited thereto. The first insulating layer 34 may, for example, include silicon oxide, silicon nitride, or other suitable insulating materials. The first insulating layer 34 may include a single-layered structure or a multilayer structure.

In some embodiments, the reflective element 36 and the connecting element 38 may include different materials. For example, the connecting element 38 may include a metal material, and the reflective element 36 may include a plurality of insulating layers, in which the insulating layers may include insulating materials. In such case, the reflective element 36 and the connecting element 38 may be formed separately. The manner for forming the connecting element 38 may, for example, include forming a conductive layer and then patterning the conductive layer to form the connecting element 38 in the through hole 32. The manner for forming the reflective element 36 may include, for example, forming a plurality of insulating layers and then patterning the insulating layers to form a stack of the insulating layers with reflective characteristics on the sidewalls of the light emitting diode islands 30. In some embodiments, the step of forming the connecting element 38 may be performed after or before the step of forming the reflective element 36. The insulating layers may include, for example, a distributed Bragg reflector (DBR), but not limited thereto.

As shown in FIG. 3, after the reflecting element 36 and the connecting element 38 are formed, a second insulating layer 40 may be formed on the connecting element 38, the reflecting element 36 and the first insulating layer 34. Then, a part of the second insulating layer 40 may be removed to expose a part of the first insulating layer 34 and a part of the reflective element 36 on the light emitting diode islands 30. Next, as shown in FIG. 4, a patterning process may be performed on the exposed first insulating layer 34 and the second insulating layer 40 to form a plurality of through holes 42 in the first insulating layer 34 on the light emitting diode islands 30, respectively, and at least one through hole 44 in the second insulating layer 40 on the connecting element 38. Accordingly, the second semiconductor layers 26 of the light emitting diode islands 30 and the connecting element 38 are exposed. The second insulating layer 40 may include an organic insulating layer, such as an organic photoresist material, resin, or other suitable insulating materials, or an inorganic insulating layer, such as silicon oxide, silicon nitride, or other suitable insulating materials. The second insulating layer 40 may include a single-layered structure or a multilayer structure.

As shown in FIG. 5, a plurality of electrodes 46 may be respectively formed in the through holes 42, and at least one connecting element 48 may be formed in the through hole 44. Both the electrodes 46 and the connecting element 48 may be formed by forming the same conductive layer and then patterning the same conductive layer, but not limited thereto. In some embodiments, the electrodes 46 and the connecting element 48 may be formed separately. The electrodes 46 and the connecting element 48 may, for example, include a conductive material, but not limited thereto.

Figure 6:
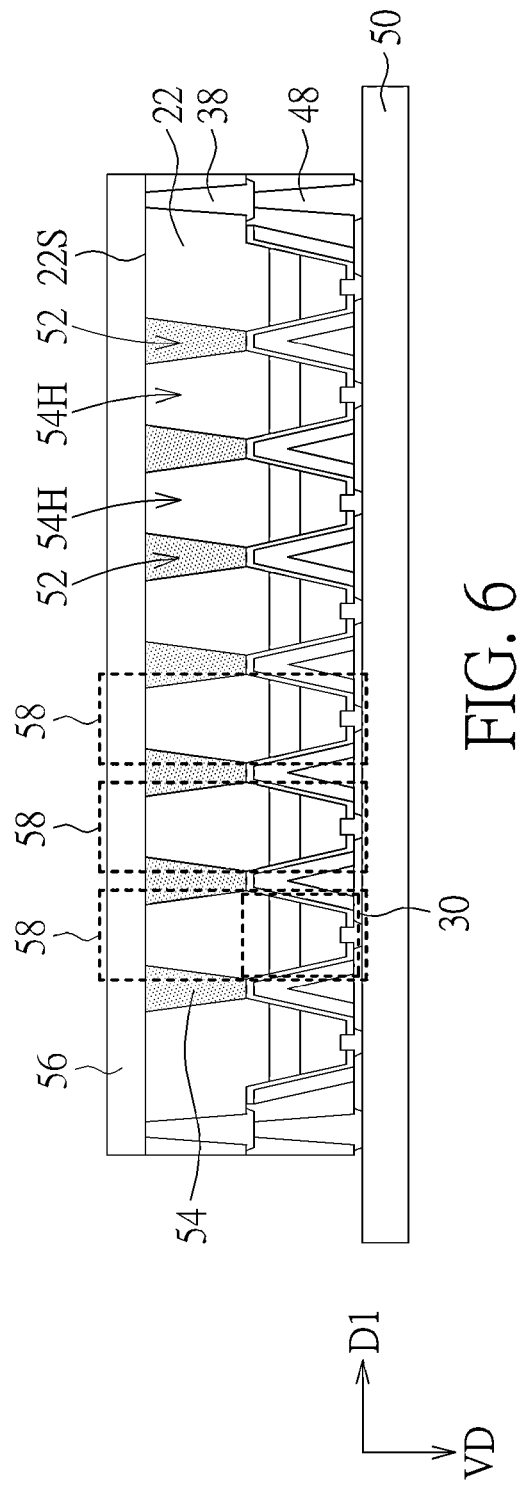
Figure 24:
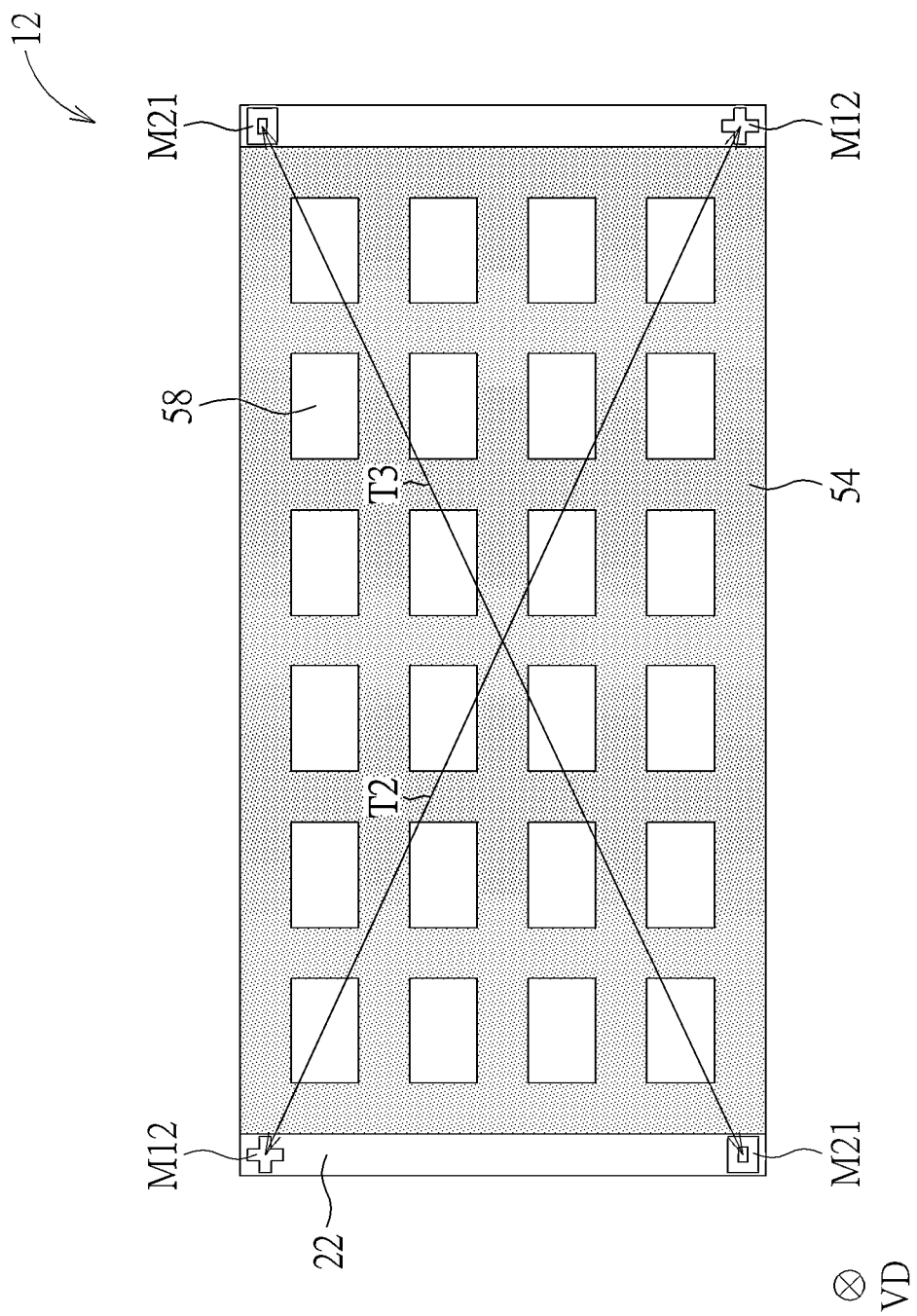

As shown in FIG. 6, the light emitting diode islands 30 may be turned upside down and disposed on another carrier 50, and then the carrier 20 may be removed, such that the surface 22S of the first semiconductor layer 22 away from the light emitting diode islands 30 may be exposed. Next, a photolithography and etching process may be performed to form a trench 52 in the first semiconductor layer 22. Since FIG. 6 shows a cross-sectional view of the trench 52 along a direction D1, a plurality of trenches 52 shown in FIG. 6 may respectively represent different parts of the trench 52 located at different positions. As shown in FIG. 6, the trench 52 may correspond to the trench 28 in the top view direction VD, so the trench 52 may expose the first insulating layer 34. Then, a light blocking pattern 54 may be formed in the trench 52, such that a light passing through hole 54H may be between two adjacent parts of the light blocking pattern 54 respectively in different parts of the trench 52, and a plurality of the light passing through holes 54H may correspond to the light emitting diode islands 30, respectively, as shown in FIG. 6. In other words, the trench 52 may at least partially overlap the trench 28 in the top view direction VD, but not limited thereto. As shown in FIG. 6, a top view of the light blocking pattern 54 may be as shown in FIG. 24, but not limited thereto. Then, a transparent conductive layer 56 may be formed on the first semiconductor layer 22 and the connecting element 38 to form a plurality of light emitting units 58, wherein the light passing through holes 54H may correspond to the light emitting units 58, respectively. The light emitting units 58 may share the same transparent conductive layer 56, so that the first semiconductor layers 22 of the light emitting units 58 may be electrically connected to each other, and the transparent conductive layer 56 may electrically connect the first semiconductor layers 22 of the light emitting units 58 to the connecting element 38. In some embodiments, the transparent conductive layer 56 may include, for example, a transparent conductive material, a thin metal, or other conductive materials that allow light to penetrate, but not limited thereto. It should be noted that the light passing through holes 54H disposed correspondingly on the light emitting diode islands 30 may help guiding light generated from the light emitting layers 24 of the light emitting diode islands 30 to improve the collimation of the light emitted to the light conversion module. In some embodiments, the light blocking pattern 54 may include a light absorbing material, a metal material, a stack of insulating layers, or other suitable light blocking materials, but not limited thereto. The light absorbing material may include, for example, a black photoresist material or an ink material, but not limited thereto.

Figure 7:
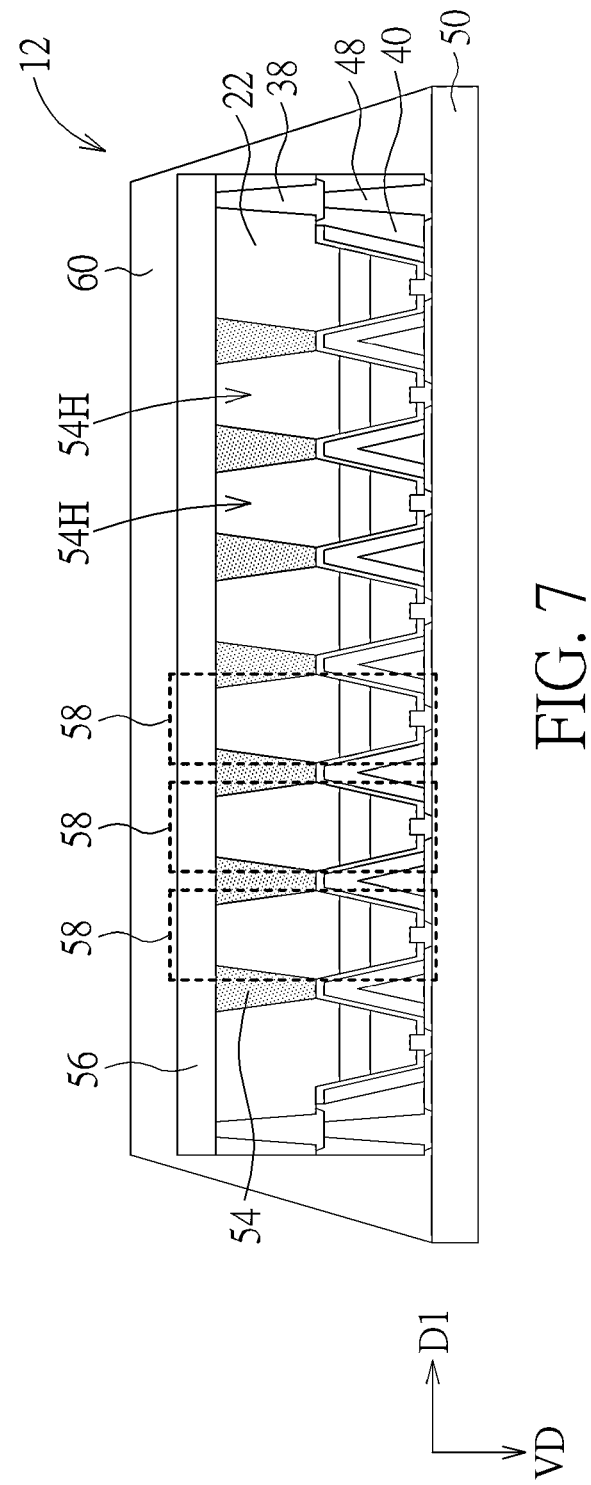

As shown in FIG. 7, a protecting layer 60 may be formed on the transparent conductive layer 56, thereby forming the light emitting module 12, wherein the light emitting module 12 may include at least two or more light emitting units 58, and the light emitting units 58 may share the same transparent conductive layer 56. In some embodiments, the light emitting units 58 may, for example, generate blue light, white light, ultraviolet light, red light, green light, yellow light, but not limited thereto. In some embodiments, the light emitting module 12 may be an uncut light emitting module board, and/or an object that may be individually moved by the carrier 50. In some embodiments, the protecting layer 60 may extend to the sidewalls of the first semiconductor layer 22 and the sidewalls of the second insulating layer 40 to protect the light emitting units 58, the connecting element 38 and the connecting element 48. In some embodiments, after the light emitting module 12 is formed and before the step S18 of assembling the light emitting module 12 shown in FIG. 1, the light emitting module 12 may be inspected, but not limited thereto. In some embodiments, the protecting layer 60 may, for example, include an inorganic material layer or an organic material layer. For example, the inorganic material layer may include silicon nitride, silicon oxide, silicon oxynitride, aluminum oxide, other suitable protecting materials, or any combination of the above inorganic materials, but not limited thereto. The organic material layer may include resin, but not limited thereto.

Figure 8:
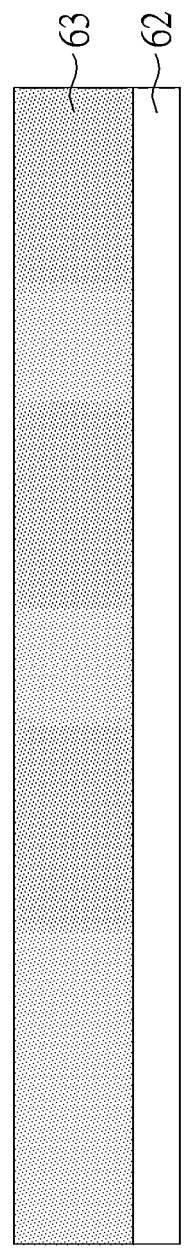
FIG. 8 to FIG. 9 schematically illustrate a method for forming the light blocking pattern with a plurality of light passing through holes before providing the light conversion module according to some embodiments of the present disclosure.
Figure 9:
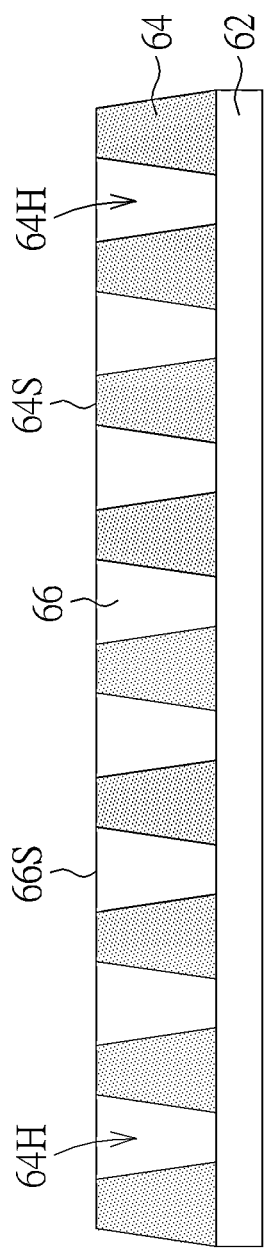

FIG. 8 to FIG. 9 schematically illustrate a method for forming the light blocking pattern with a plurality of light passing through holes before providing the light conversion module according to some embodiments of the present disclosure. As shown in FIG. 8, before providing or forming the light conversion module 14, a light blocking layer 63 may optionally be formed on the carrier 62. Subsequently, as shown in FIG. 9, the light blocking layer 63 may be patterned to form a light blocking pattern 64 having a plurality of light passing through holes 64H. Next, a filling layer 66 may be formed in the light passing through holes 64H to fill the light passing through holes 64H. For example, an upper surface 66S of the filling layer 66 and an upper surface 64S of the light blocking pattern 64 may form a planar plane, but not limited thereto. In some embodiments, the filling layer 66 may extend to the upper surface 64S of the light blocking pattern 64, so that the upper surface 66S of the filling layer 66 may form the planar plane to facilitate the formation of the light conversion module 14 shown in FIG. 10, but not limited thereto. The light passing through holes 64H of the light blocking pattern 64 may improve the collimation of light passing through the light passing through holes. In some embodiments, the filling layer 66 may include, for example, a transparent photoresist material or other suitable materials, but not limited thereto. The filling layer 66 may include a single-layered structure or a multilayer structure.

Figure 10:
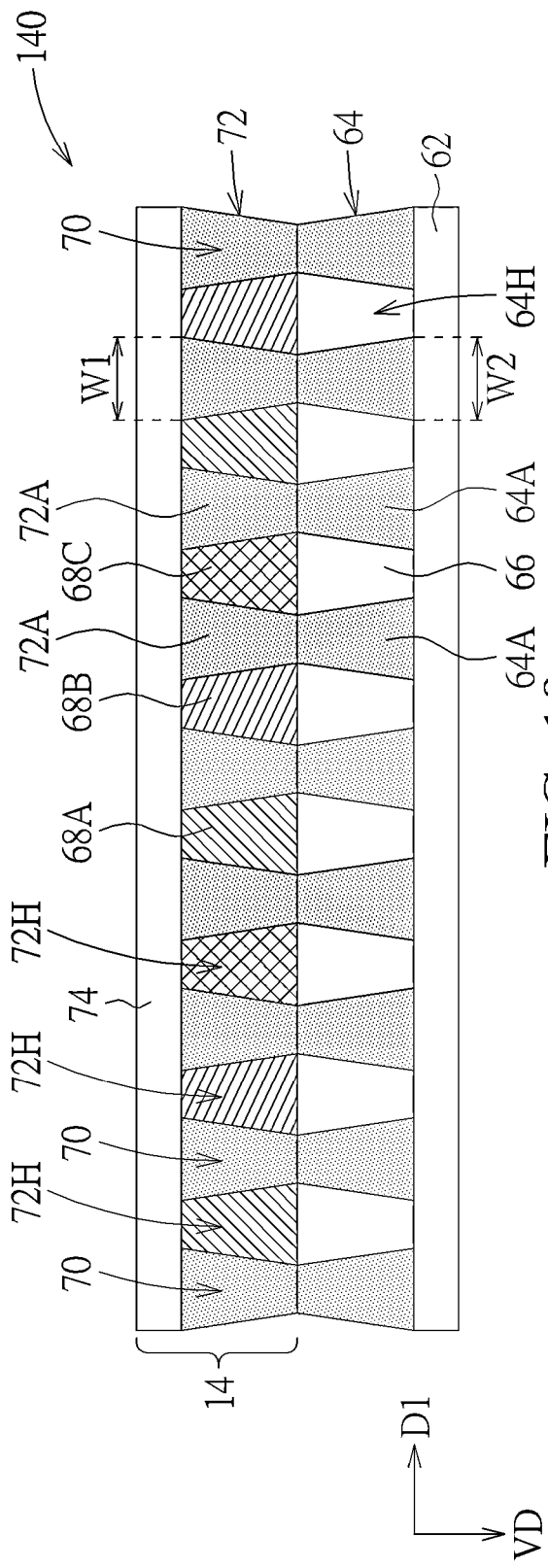
FIG. 10 schematically illustrates a method for providing the light conversion module according to some embodiments of the present disclosure.

FIG. 10 schematically illustrates a method for providing the light conversion module according to some embodiments of the present disclosure. As shown in FIG. 10, after the filling layer 66 is formed, the step S14 of providing the light conversion module 14 shown in FIG. 1 may be performed to form the light conversion module 14 on the filling layer 66 and the light blocking pattern 64. For clarity, a combination of the light conversion module 14, the light blocking pattern 64 and the filling layer 66 may be called a light conversion assembly 140, but not limited thereto. The light conversion module 14 may include a first light conversion layer 68A, a second light conversion layer 68B, a third light conversion layer 68C, a light blocking pattern 72, and a protecting layer 74. The first light conversion layer 68A, the second light conversion layer 68B and the third light conversion layer 68C may be used to convert absorbed light into light of a first color, a second color and a third color different from each other, respectively. The first color, the second color and the third color may be, for example, red, green and blue or other color combinations that are capable of being mixed into white light, but not limited thereto. Any two of the first light conversion layer 68A, the second light conversion layer 68B and the third light conversion layer 68C adjacent to each other may be separated by the light blocking pattern 72 to reduce light mixing problem. In the top view direction VD perpendicular to an upper surface of the carrier 62, the light blocking pattern 72 may correspond to the light blocking pattern 64 and have a top view pattern similar to or the same as the light blocking pattern 64. For example, in the cross-section of FIG. 10 (e.g., the cross-section taken along the direction D1), the light blocking pattern 72 may include a plurality of blocks 72A, and the light blocking pattern 64 may also include a plurality of blocks 64A corresponding to the blocks 72A, respectively, and an overlapping area of one of the block 72As and a corresponding one of the blocks 64A may be greater than half of an area of the block 72A in the top view direction VD. In some embodiments, for improving the collimation of the light converted by the first light conversion layer 68A, the second light conversion layer 68B and the third light conversion layer 68C and emitted out the display device, a maximum width W1 of the block 72A in the direction D1 may be less than a maximum width W2 of the block 64A in the direction D1.

The method for forming the light conversion module 14 may be specified in the following description, but not limited thereto. As shown in FIG. 10, the first light conversion layer 68A, the second light conversion layer 68B and the third light conversion layer 68C may be formed on the fill layer 66 and the light blocking pattern 64. In the embodiment of FIG. 10, each of the first light conversion layer 68A, the second light conversion layer 68B and the third light conversion layer 68C may include, for example, a photoresist material, an ink material, a phosphor material, a fluorescent material, quantum dots, a color filter material, a combination of at least two of the above or other light conversion materials capable of converting color of light, and the above light conversion materials may be arbitrarily combined and not limited thereto. Taking the photoresist material as an example, the method for forming the first light conversion layer 68A may include forming a first light conversion photoresist on the fill layer 66 and then patterning the first light conversion photoresist. Similarly, the second light conversion layer 68B may be formed by forming a second light conversion photoresist on the fill layer 66 and then patterning the second light conversion photoresist, and the third light conversion layer 68C may be formed by forming a third light conversion photoresist on the fill layer 66 and then patterning the third light conversion photoresist. In FIG. 10, the first light conversion layer 68A, the second light conversion layer 68B and the third light conversion layer 68C may be sequentially formed, but not limited thereto. In some embodiments, the sequence of forming the first light conversion layer 68A, forming the second light conversion layer 68B and forming the third light conversion layer 68C may be arbitrarily adjusted according to requirements.

In some embodiments, when the color generated by the light emitting unit 58 in FIG. 7 may be used as the color of one sub-pixel, one of the first light conversion layer 68A, the second light conversion layer 68B and the third light conversion layer 68C which generates the same color as the light emitting unit 58 may be replaced with a filling layer, wherein the filling layer may include transparent resin or other suitable materials, but not limited thereto. In some embodiments, when the color generated by the light emitting unit 58 is blue, the first light conversion layer 68A may convert blue light into red light, the second light conversion layer 68B may convert blue light into green light, and the third light conversion layer 68C may be replaced with the filling layer, for example.

As shown in FIG. 10, after the first light conversion layer 68A, the second light conversion layer 68B and the third light conversion layer 68C are formed, a patterning process may be performed to form an opening 70 at the outermost sides of the first light conversion layer 68A, the second light conversion layer 68B and the third light conversion layer 68C and between adjacent two of the first light conversion layer 68A, the second light conversion layer 68B and the third light conversion layer 68C. In the top view direction VD perpendicular to the upper surface of the carrier 62, the opening 70 may correspond to the light blocking pattern 64 and expose the light blocking pattern 64. Then, the light blocking pattern 72 may be disposed in the opening 70. Then, a protecting layer 74 may be formed on the light blocking pattern 72, the first light conversion layer 68A, the second light conversion layer 68B, and the third light conversion layer 68C, thereby forming the light conversion module 14. In the embodiment of FIG. 10, the light blocking pattern 72 may include a plurality of light passing through holes 72H to allow light to pass through the light passing through holes 72H, wherein the light passing through holes 72H may respectively correspond to the first light conversion layer 68A, the second light conversion layer 68B, and the third light conversion layer 68C. In some embodiments, the protecting layer 74 may, for example, include the same material as the protecting layer 60, but not limited thereto.

In some embodiments, the light blocking pattern 72 may include, for example, a black photoresist material or an ink material. In some embodiments, the step of forming the light blocking pattern 72 may be performed before forming the first light conversion layer 68A, the second light conversion layer 68B, and the third light conversion layer 68C or between forming two of the first light conversion layer 68A, the second light conversion layer 68B, and the third light conversion layer 68C. In some embodiments, the light blocking pattern 64 and the filling layer 66 may not be formed before forming the light conversion module 14. In such case, the light conversion module 14 may be directly formed on the carrier 62.

Figure 11:
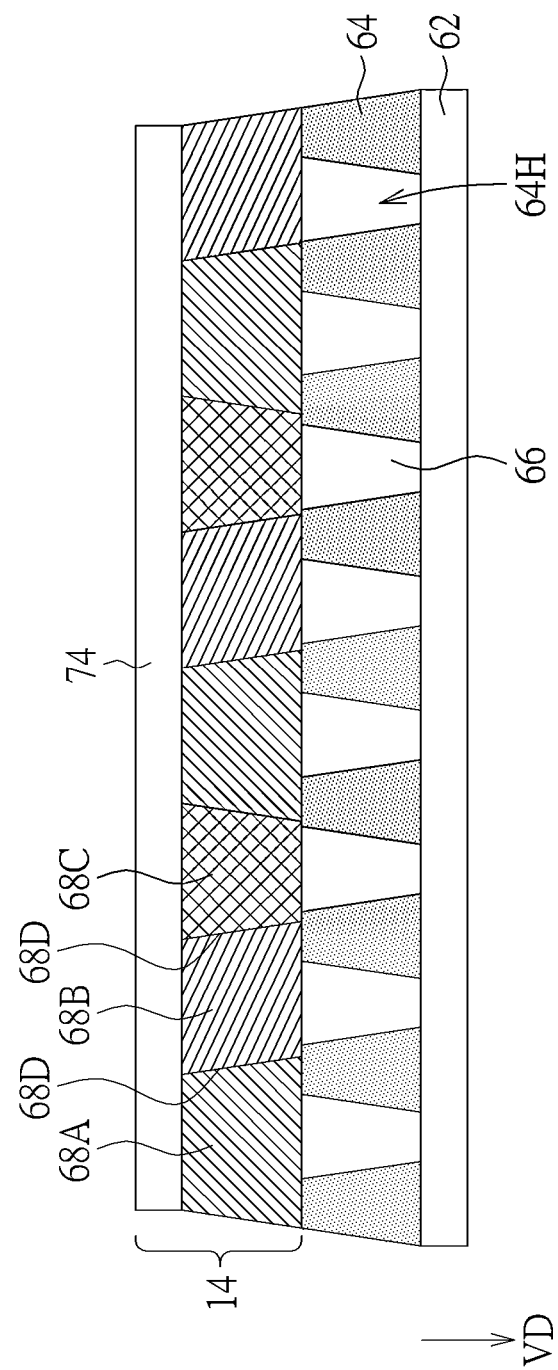
FIG. 11 schematically illustrates a method for providing the light conversion module 14 according to some embodiments of the present disclosure.

FIG. 11 schematically illustrates a method for providing the light conversion module 14 according to some embodiments of the present disclosure. As shown in FIG. 11, after the filling layer 66 is formed, the light conversion module 14 may be formed on the filling layer 66 and the light blocking pattern 64. The method for forming the light conversion module 14 shown in FIG. 11 may not require the step of providing the light blocking pattern 72 in FIG. 10, and as shown in FIG. 11, the first light conversion layer 62A, the second light conversion layer 68B, and the third light conversion layer 68C are formed on the filling layer 66 and the light blocking pattern 64, wherein a border 68D between the first light conversion layer 68A and the second light conversion layer 68B may correspond to the light blocking pattern 64. Accordingly, regarding light mixing problem occurring at the border 68D between the first light conversion layer 68A and the second light conversion layer 68B, the light blocking pattern 64 corresponding to the border 68D between the first light conversion layer 68A and the second light conversion layer 68B may shield a region where light mixing may occur. Similarly, the border 68D between the first light conversion layer 68A and the third light conversion layer 68C and the border 68D between the second light conversion layer 68B and the third light conversion layer 68C may also correspond to the light blocking pattern 64. Accordingly, the step of providing or forming the light conversion module 14 may omit the step of forming the light blocking pattern 72 shown in FIG. 10. The subsequent steps and processes of FIG. 11 may refer to or the same as the description of FIG. 10 and will not be repeated herein.

Figure 12:
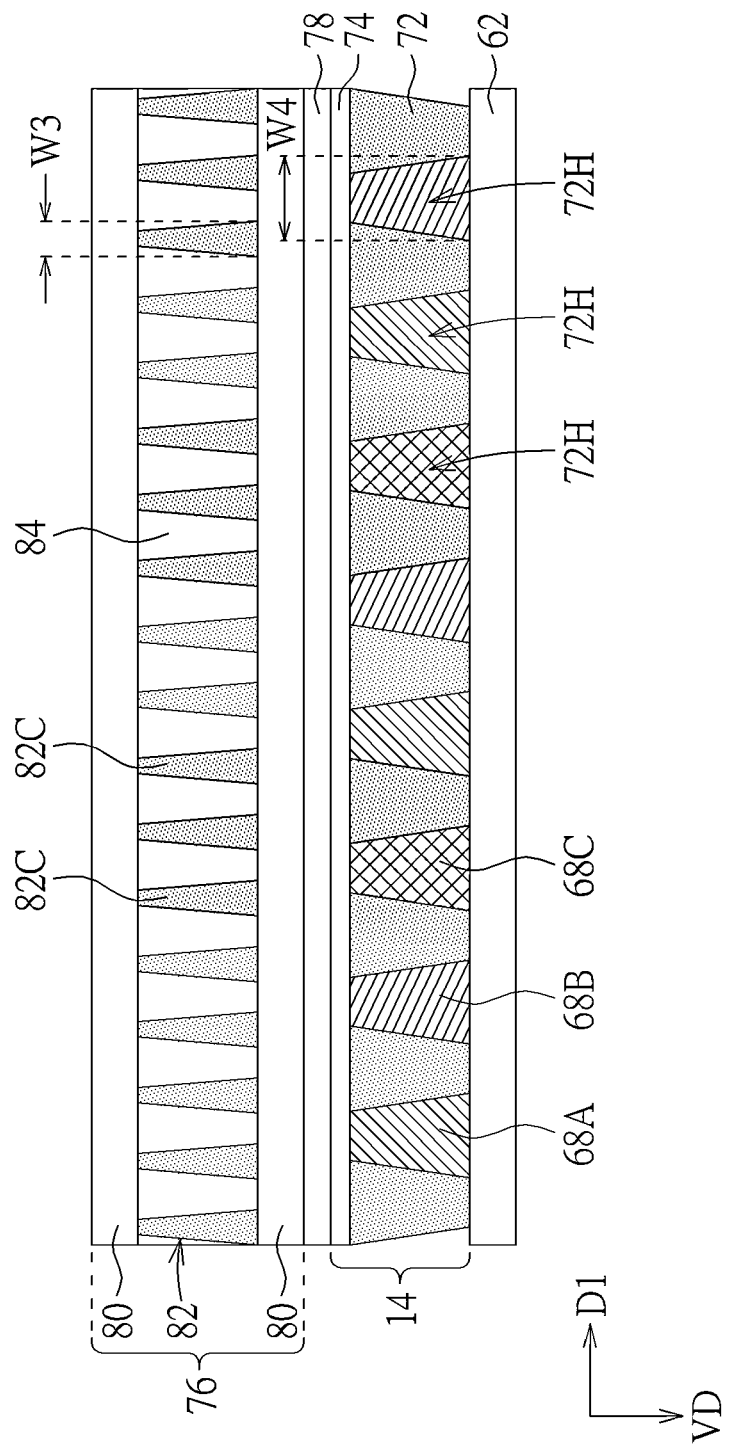
FIG. 12 schematically illustrates methods for providing the light conversion module and assembling a light collimating module according to some embodiments of the present disclosure.

FIG. 12 schematically illustrates methods for providing the light conversion module and assembling a light collimating module according to some embodiments of the present disclosure. As shown in FIG. 12, the light blocking pattern and the filling layer may be replaced by a light collimating module 76 having a function of collimating light. In some embodiments, the light conversion module 14 may be directly formed on the carrier 62, and then the light collimating module 76 is provided, and the light collimating module 76 is assembled on the light conversion module 14. In some embodiments, the light conversion module 14 may be an uncut light conversion module board and/or an object that may be individually moved by the carrier 62. The light collimating module 76 may be attached to the protecting layer 74 of the light conversion module 14 through an adhesive layer 78, but not limited thereto. The adhesive layer 78 may, for example, include transparent glue or other suitable transparent adhesive materials.

Figure 23:
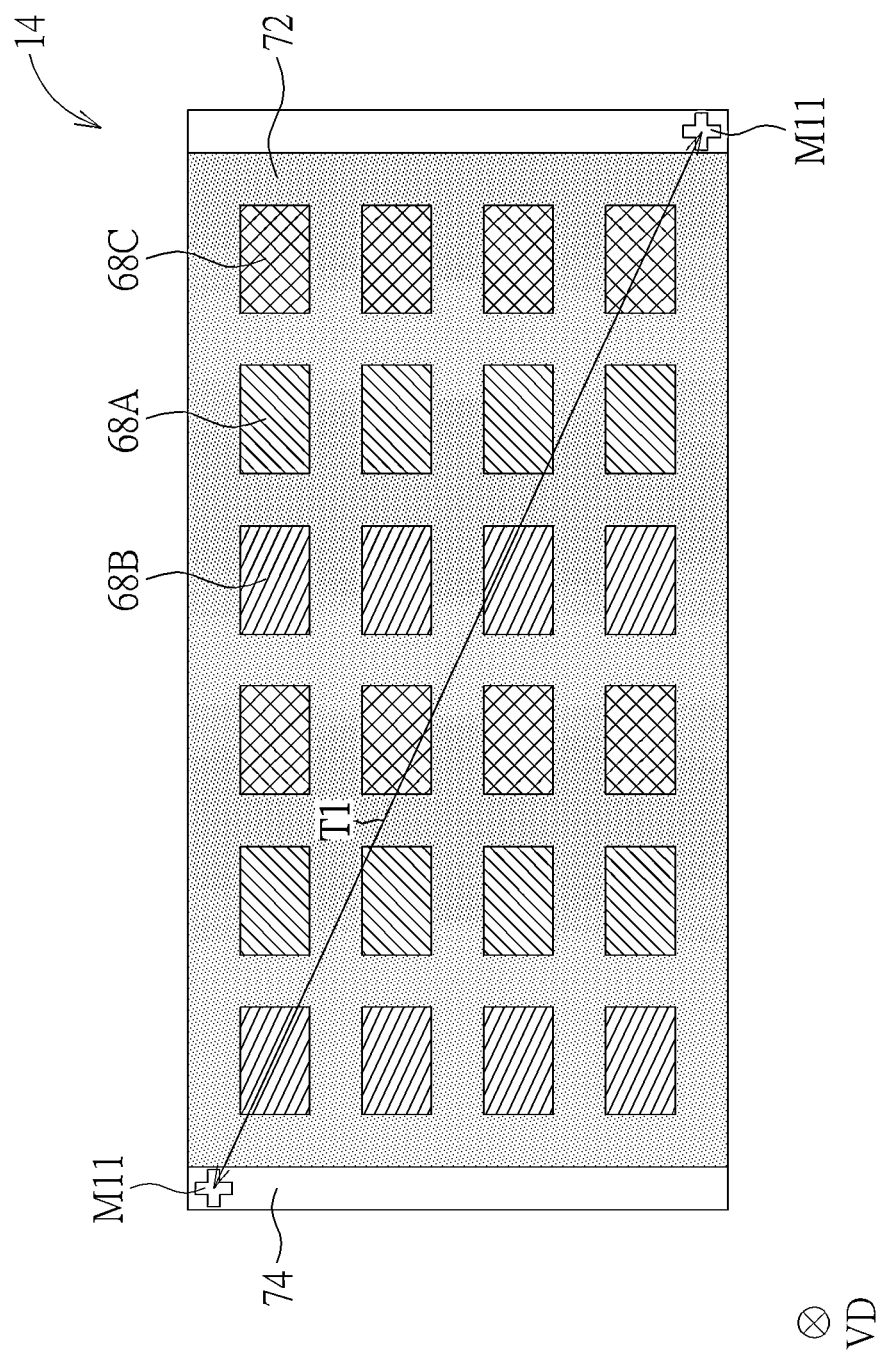
FIG. 23 to FIG. 25 schematically illustrate top views of the light emitting module, the driving module, and the light conversion module according to some embodiments of the present disclosure.

In the embodiment of FIG. 12, the light collimating module 76 may include two protecting films 80 and a collimating pattern layer 82, wherein the collimating pattern layer 82 is disposed between the protecting films 80. The collimating pattern layer 82 may include, for example, a light blocking material, but not limited thereto. The collimating pattern layer 82 may be formed, for example, by a nano-imprint lithography process, a photolithography process, or other suitable processes. The collimating pattern layer 82 may, for example, include a photoresist material or other materials suitable for the imprinting process, but not limited thereto. In FIG. 12, the collimating pattern layer 82 may have a plurality of pillar structures 82C arranged between the protecting films 80. A filling layer 84 may be optionally disposed between the pillar structures 82C, but not limited thereto. The filling layer 84 may allow light to pass through and include, for example, a transparent resin or other suitable materials, but not limited thereto. In some embodiments, while viewed along the top view direction VD perpendicular to the upper surface of the carrier 62, a maximum width W3 of the pillar structure 82C in the direction D1 may be less than half of a maximum width W4 of the light passing through hole 72H in the direction D1. The maximum width W3 of the pillar structure 82C may be, for example, the maximum width of one of the pillar structures 82C in the direction D1, and the maximum width W4 of the light passing through hole 72H may be, for example, the maximum width of one of the light passing through holes 72H in the direction D1. In some embodiments, the pillar structures 82C may be connected to each other to form a grid shape in the top view direction VD, as shown in FIG. 23.

Figure 13:
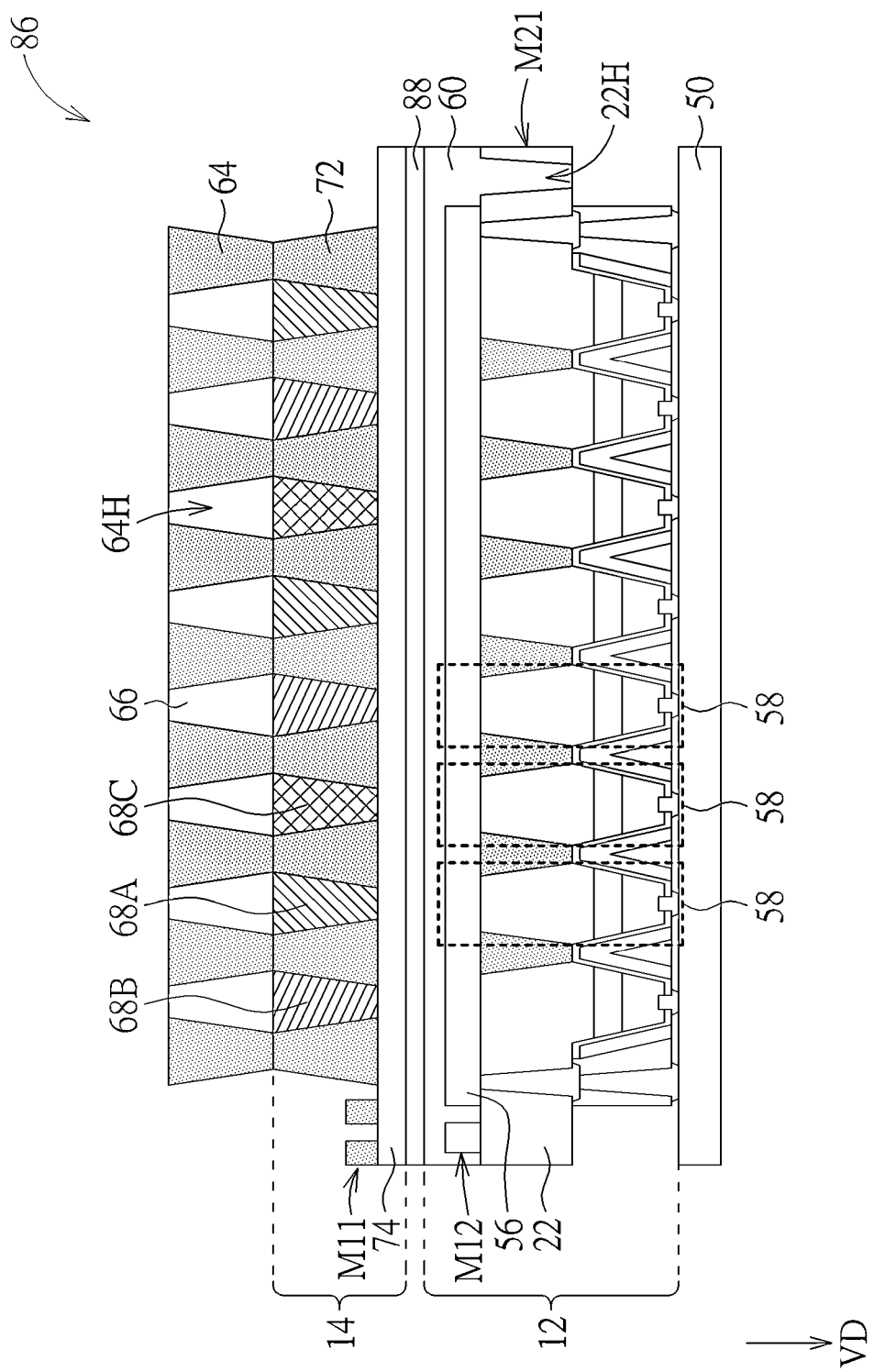
FIG. 13 and FIG. 14 schematically illustrate the method for assembling the light emitting module, the driving module, and the light conversion module according to some embodiments of the present disclosure.
Figure 14:
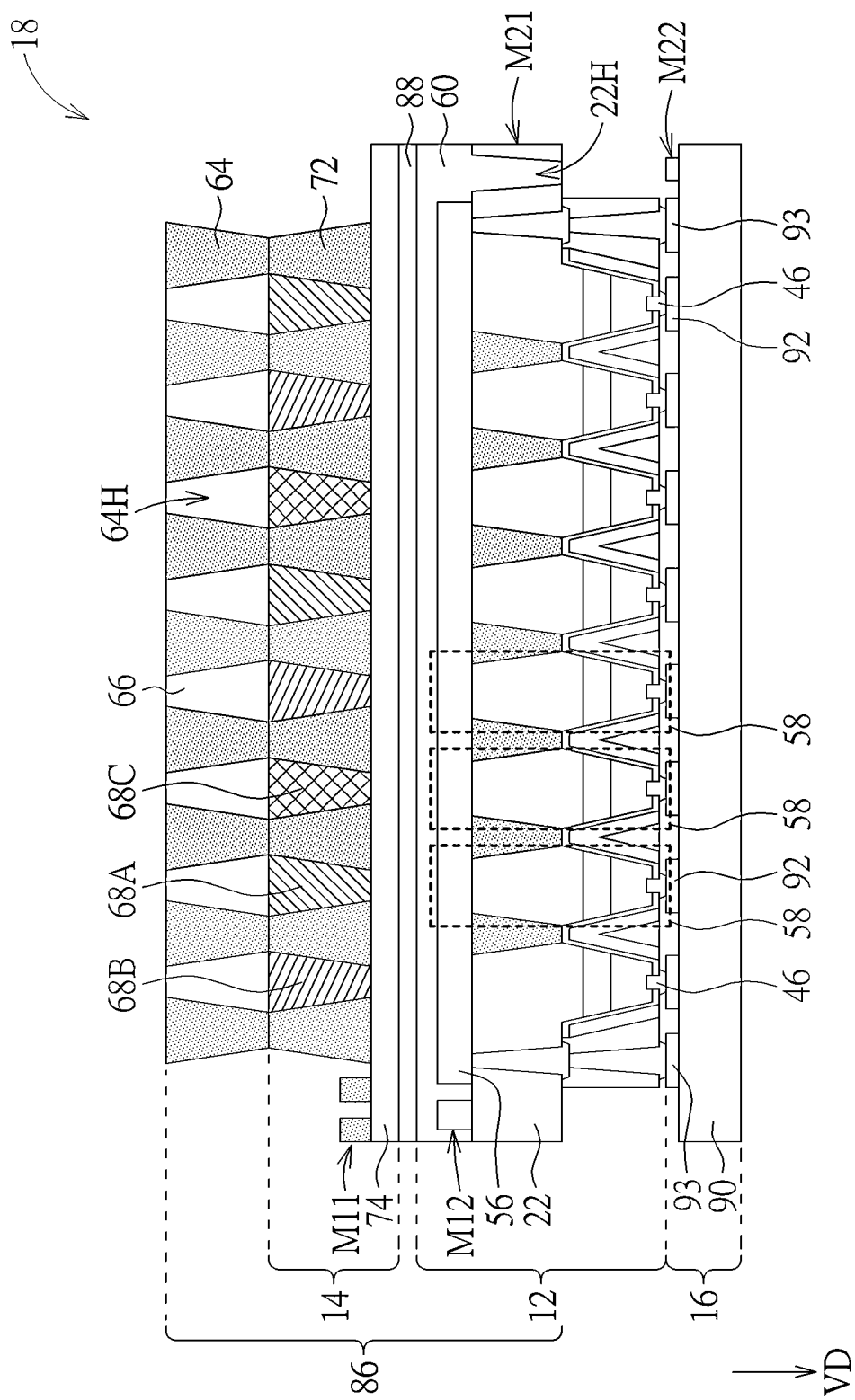

The following description further details the step S18 of assembling the light emitting module, the driving module and the light conversion module shown in FIG. 1 with reference to FIG. 13 and FIG. 14. FIG. 13 and FIG. 14 schematically illustrate the method for assembling the light emitting module, the driving module, and the light conversion module according to some embodiments of the present disclosure. As shown in FIG. 1 and FIG. 13, in step S18 of some embodiments, the light conversion module 14 and the light emitting module 12 may be assembled first to form an assembly 86. In the embodiment of FIG. 13, when a size of the light conversion module 14 may be less than or the same as a size of the light emitting module 12, the light conversion module 14 may be directly attached to the light emitting module 12, but not limited thereto.

The light conversion module 14 and the light blocking pattern 64 shown in FIG. 10 are taken as an example, and there are the light blocking pattern 64 and the filling layer 66 formed on the light conversion module 14. In such case, the protecting layer 74 of the light conversion module 14 is attached to the protecting layer 60 of the light emitting module 12 through an adhesive layer 88 in a manner that the protecting layer 74 of the light conversion module 14 faces the protecting layer 60 of the light emitting module 12 shown in FIG. 7, such that the light conversion module 14 may be located between the light blocking pattern 64 and the light emitting module 12. The adhesive layer 88 may be coated on the protecting layer 74 of the light conversion module 14 or the protecting layer 60 of the light emitting module 12 and followed by performing the assembling process and removing the carrier 62, thereby forming the assembly 86. In some embodiments, when the light conversion module 14 is the light conversion module 14 attached with the light collimating module 76 as shown in FIG. 12, the first light conversion layer 68A, the second light conversion layer 68B, the third light conversion layer 68C, and the light blocking pattern 72 of the light conversion module 14 may be attached to the protecting layer 60 of the light emitting module 12 through the adhesive layer 88, such that the first light conversion layer 68A, the second light conversion layer 68B, the third light conversion layer 68C, and the light blocking pattern 72 may be located between the protecting layer 74 and the light emitting module 12, but not limited thereto. In some embodiments, the light conversion module 14 that does not have the light collimating module 76 attached thereon may be assembled on the light emitting module 12, and then the light collimating module 76 may be attached to the light conversion module 14. The adhesive layer 88 may, for example, include transparent glue or other suitable transparent adhesive materials. In some embodiments, the adhesive layer 88 may include nontransparent glue coated in a non-display region, for example coated at a region where peripheral traces are disposed or a region corresponding to the light blocking pattern 64.

It should be noted that, in the embodiment of FIG. 13, the light conversion module 14 may include an alignment mark M11, and the light emitting module 12 may include an alignment mark M12, such that the alignment mark M11 may be used to align with the alignment mark M12, and the alignment mark M11 and the alignment mark M12 may form an alignment mark group. Accordingly, the light conversion module 14 and the light emitting module 12 may be assembled by aligning the alignment mark M11 with the alignment mark M12, so that the light emitting units 58 of the light emitting module 12 may be effectively aligned with the light passing through holes 72H of the light conversion module 14, for example. In some embodiments, the alignment mark M11 and the light blocking pattern 72 may be formed by patterning the same light blocking layer. In the top view direction VD, a thickness of the alignment mark M11 may be less than a thickness of the light blocking pattern 72, and in such case, the alignment mark M11 and the light blocking pattern 72 may be formed by using a halftone mask, a gray tone mask, or other suitable patterned light blocking layer for mask, but not limited thereto. In some embodiments, the alignment mark M11 and the light blocking pattern 72 may be formed separately.

In some embodiments, the light emitting module 12 may further include an alignment mark M21 for aligning the driving module 16 shown in FIG. 14. The alignment mark M21 may include, for example, a through hole 22H of the first semiconductor layer 22. In order to reduce alignment deviation, the through hole 22H penetrating the first semiconductor layer 22 may improve alignment accuracy. In some embodiments, a transparent protecting layer 60 may be disposed in the through hole 22H of the first semiconductor layer 22.

As shown in FIG. 1 and FIG. 14, before the step S18 is performed, the driving module 16 may be provided. In the embodiment shown in FIG. 14, the driving module 16 may include a control circuit substrate 90, a plurality of electrodes 92, and at least one electrode 93. The electrodes 92 and the electrodes 93 may be disposed on the control circuit substrate 90 and may be provided with driving voltages by the control circuit substrate 90. For example, the control circuit substrate 90 may include scan lines, data lines, power lines, or other elements for driving the light emitting module 12, but not limited thereto. The driving module 16 may include, for example, a single crystal semiconductor substrate (such as single crystal silicon semiconductor substrate), a thin film transistor substrate, or other suitable circuit substrates. The single crystal semiconductor substrate may, for example, include P-type transistors, N-type transistors, or a mixture of the above mentioned, but not limited thereto. In some embodiments, the driving module 16 may be an uncut driving module board and/or an object that may be individually moved by the carrier.

In some embodiments, the driving module 16 may include an alignment mark M22 for aligning the alignment mark M21 of the light emitting module 12, so that the alignment mark M21 and the alignment mark M22 may form another alignment mark group. In some embodiments, the alignment mark M22, the electrodes 92 and the electrode 93 may, for example, include the same metal material or be formed of the same nontransparent conductive layer, but not limited thereto.

Figure 15:
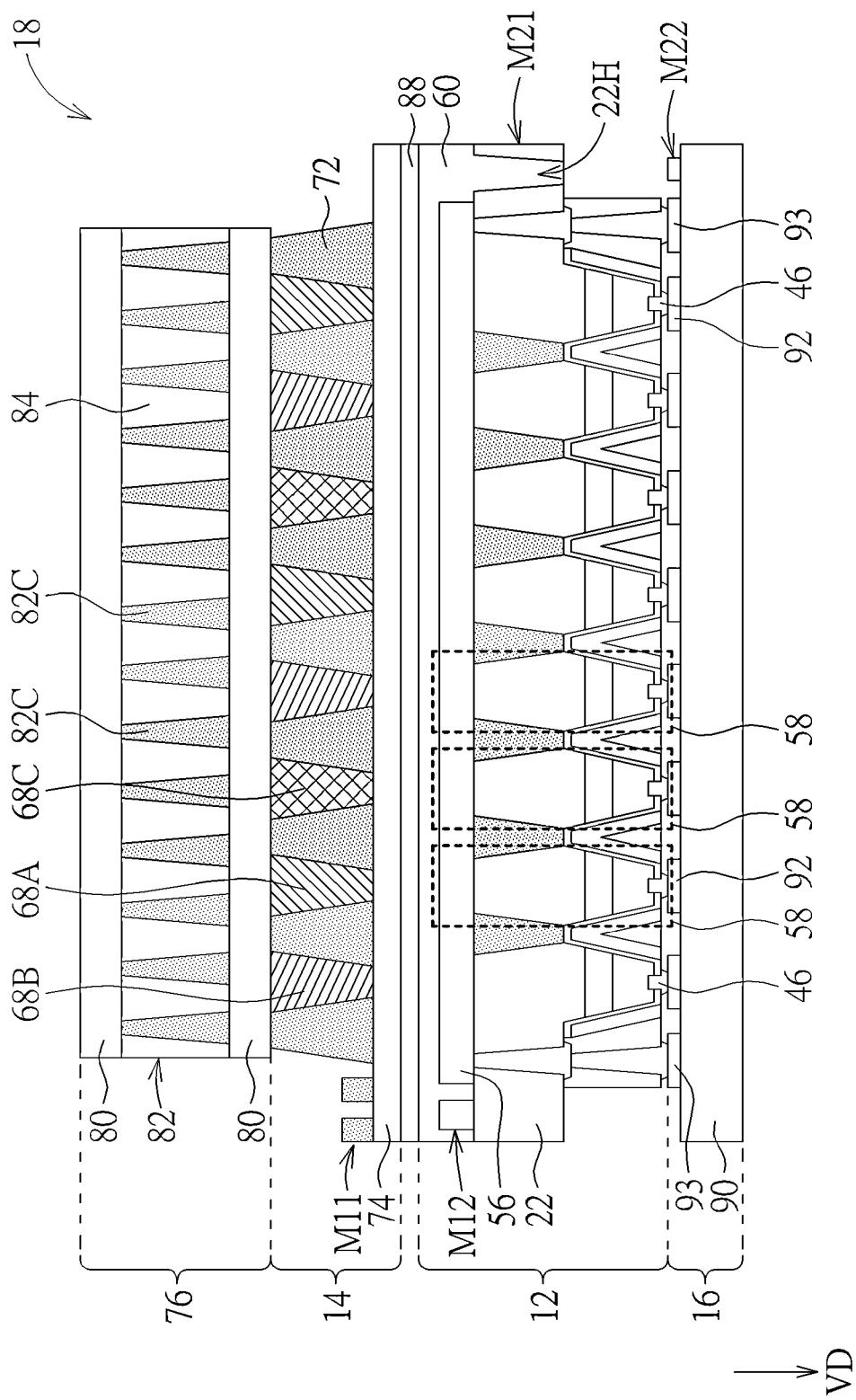
FIG. 15 schematically illustrate the method for assembling the light collimating module according to some embodiments of the present disclosure.

As shown in FIG. 13 and FIG. 14, after the driving module 16 is provided, the assembly 86 including the light emitting module 12 and the light conversion module 14 may be assembled on the driving module 16, thereby forming a display assembly 18. The light emitting module 12, the light conversion module 14 and the driving module 16 may be uncut boards and/or objects that may be moved separately through the carrier. In some embodiments, the display assembly 18 may not be limited to be formed of the light emitting module 12, the light conversion module 14 and the driving module 16, and the display assembly 18 may be formed by multiple modules and/or other elements outside the modules, but not limited thereto. In some embodiments, as shown in FIG. 15, the light conversion module 14, the light emitting module 12, and the driving module 16 may be assembled first instead of providing the light collimating module 76 of FIG. 12 on the light conversion module 14 first, and after the display assembly 18 are completed, the light collimating module 76 may be provided and assembled on the display assembly 18. As shown in FIG. 13 and FIG. 14, the assembly 86 may be bonded to the driving module 16 by a conductive glue (not shown) in a manner that the electrode 46 of the light emitting module 12 faces an electrode of the driving module 16. When assembling the assembly 86 and the driving module 16, by means of aligning the alignment mark M21 with the alignment mark M22, the electrodes 46 of the light emitting units 58 may be aligned with corresponding electrodes in the driving module 16, and the connecting element 48 may be aligned to the electrode 93. Accordingly, an end of each of the light emitting units 58 may be electrically connected to the corresponding electrodes 46 of the driving module 16, and another ends of the light emitting units 58 may be electrically connected to each other through the transparent conductive layer 56 and electrically connected to the electrode 93 through the connecting element 38 and the connecting element 48. In such way, the driving module 16 may be used to control brightness of light generated from the light emitting units 58. In the embodiment of FIG. 14, the light emitting module 12, the light conversion module 14 and the driving module 16 may have substantially the same size, so that the light emitting module 12, the light conversion module 14 and the driving module 16 may be assembled without cutting, but not limited thereto. For example, the light emitting module 12 may be manufactured on an 8-inch semiconductor wafer, and the driving module 16 may be manufactured on another 8-inch silicon wafer. In some embodiments, after the display assembly 18 is formed, the display assembly 18 may be inspected, but not limited thereto.

In some embodiments, the conductive glue may, for example, include an anisotropic conductive film (ACF) or other suitable conductive materials. In some embodiments, when the light emitting module 12 is attached to the driving module 16, sidewalls of the display assembly 18 may be coated with encapsulant to strengthen the bonding between the light emitting module 12 and the driving module 16.

Figure 16:
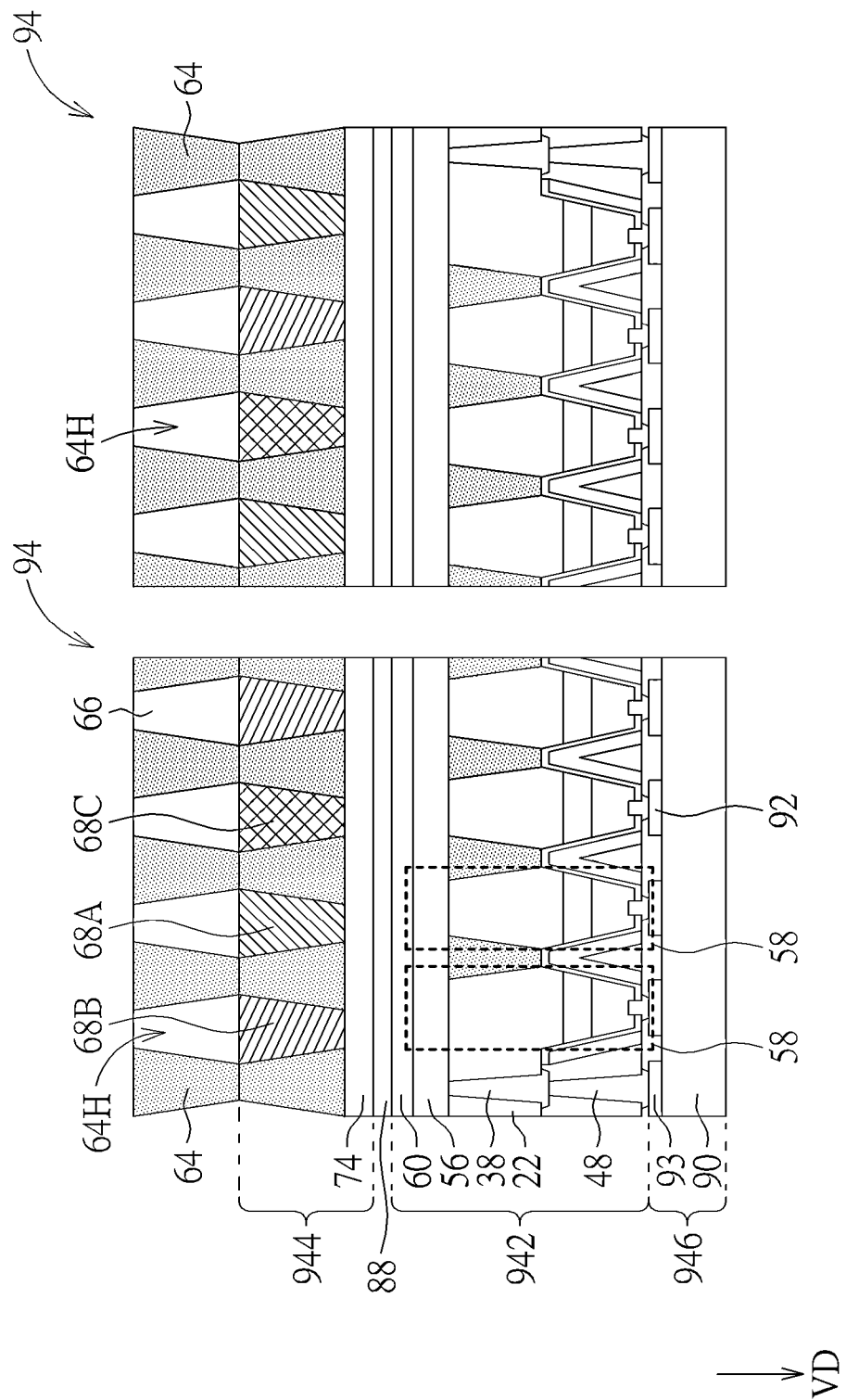
FIG. 16 schematically illustrates a cross-sectional view of a display device according to some embodiments of the present disclosure.

FIG. 16 schematically illustrates a cross-sectional view of a display device according to some embodiments of the present disclosure. As shown in FIG. 16, after the display assembly 18 is formed, the display assembly 18 may be optionally cut to form a plurality of sub-display assemblies 94. In some embodiments, one of the sub-display assemblies 94 may be used as a single display device, but not limited thereto. In some embodiments, when a size of the display assembly 18 is a size of a single display device, the display assembly 18 does not need to be cut, and the display assembly 18 may be used as the single display device. In some embodiments, the cutting process may include a chemical or physical cutting process. The chemical cutting process may, for example, include an etching process using an etching solution. The physical cutting process may include a laser cutting process, but not limited thereto.

It is noted that in the above-mentioned method for manufacturing the display device, since the light emitting units 58 are manufactured on the same first semiconductor layer 22, a distance between adjacent two of the light emitting units 58 may not be limited by the mass-transfer technique and may be significantly reduced by the semiconductor manufacturing process. Accordingly, the display device, such as a high-resolution display device, may be formed. Moreover, by means of separately manufacturing the light emitting module 12, the light conversion module 14, and the driving module 16, and then directly assembling the light emitting module 12, the light conversion module 14 and the driving module 16, difficulty in the manufacturing process may be reduced, thereby solving problems that the mass-transfer technique cannot overcome.

In the embodiment of FIG. 16, the sub-display assembly 94 may include a light emitting module 942, a driving module 946 and a light conversion module 944, wherein the light emitting module 942 is disposed between the light conversion module 944 and the driving module 946. The light emitting module 942 may include at least two light emitting units 58 and at least two or more light emitting units 58 may share the same transparent conductive layer 56. The light conversion module 944 may at least include at least two of the first light conversion layer 68A, the second light conversion layer 68B and the third light conversion layers 68C respectively corresponding to the light emitting units 58 in the top view direction VD perpendicular to an upper surface of the control circuit substrate 90, so that light generated by one of the light emitting units 58 may be absorbed by the corresponding one of the first light conversion layer 68A, the second light conversion layer 68B, and the third light conversion layer 68C and converted into light with corresponding color. After being collimated by the light passing through hole 64H, the light may be emitted out from a side of the light blocking pattern 64 opposite to the light conversion module 944. In some embodiments, when the first light conversion layer 68A, the second light conversion layer 68B, and the third light conversion layer 68C include quantum dots, the light converted by them has no directivity, and by the collimating of the light passing through holes 64H, the collimation of the light emitted from the display device may be improved. In some embodiments, one of the light emitting units 58 and the corresponding one of the first light conversion layer 68A, the second light conversion layer 68B, and the third light conversion layer 68C may form a sub-pixel of the display device, but not limited thereto. Although FIG. 16 does not show the alignment marks, the sub-display assemblies 94 of some embodiments may include the alignment mark M11, the alignment mark M12, the alignment mark M21, and/or the alignment mark M22 shown in FIG. 14, but not limited thereto. In some embodiments, the light emitting module 942, the driving module 946, and the light conversion module 944 may be formed by a cutting process. For example, the light emitting module 942 may be formed by cutting the light emitting module board, the driving module 946 may be formed by cutting the driving module board, and the light conversion module 944 may be formed by cutting the light conversion module board. Then, the carriers of the light emitting module 942, the driving module 946, and the light conversion module 944 may be moved, and the light emitting module 942, the driving module 946, and the light conversion module 944 may be assembled to form the sub-display assembly 94 through the above-mentioned alignment marks. In some embodiments, the display assembly 94 may not be limited to be formed of the light emitting module 12, the light conversion module 14 and the driving module 16 and may include other modules and/or other elements outside the modules, but not limited thereto.

It should be noted that the light emitting module 942 may be attached to the light conversion module 944 through the adhesive layer 88. In order to increase a number of light from each light emitting unit 58 entering the corresponding light conversion layer or reduce light mixing of adjacent sub-pixels, a difference between the refractive indexes of the transparent conductive layer 56 and the protecting layer 60 adjacent to each other and a difference between the refractive indexes of the protecting layer 60 and the adhesive layer 88 adjacent to each other may both be less than 0.5. For example, the transparent conductive layer 56 may include indium tin oxide (ITO), indium zinc oxide (IZO), nanometal or other suitable materials. For example, indium tin oxide has a refractive index of 1.5, the protecting layer 60 may include silicon oxide and have a refractive index of 1.46, and the adhesive layer 88 may include resin and have a refractive index of 1.5, but not limited thereto. In some embodiments, a difference between the refractive indexes between the protecting layer 74 and the adhesive layer 88 of the light conversion module 944 may be less than 0.5.

Figure 17:
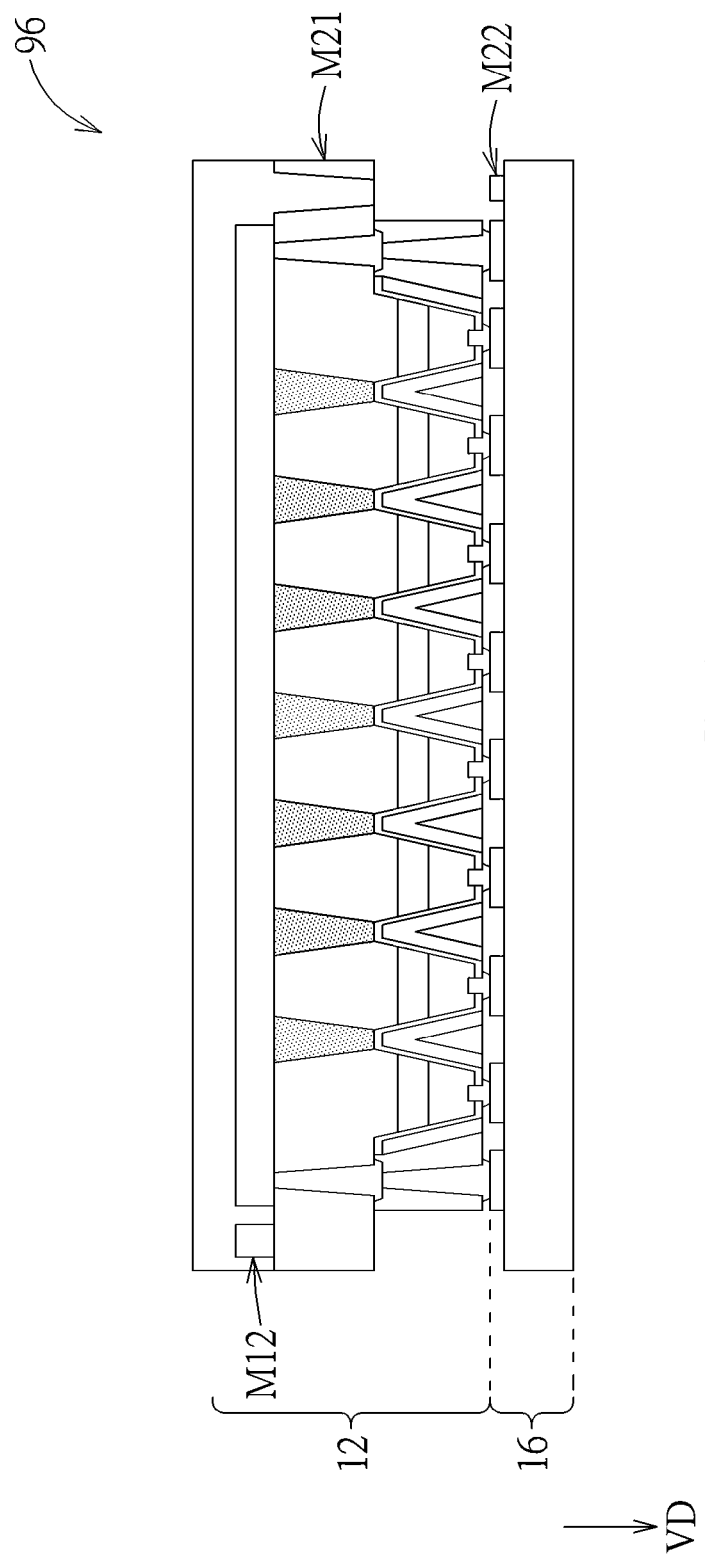
FIG. 17 schematically illustrates a method for assembling the light emitting module, the driving module, and the light conversion module according to some embodiments of the present disclosure.

The method for manufacturing the display device of the present disclosure is not limited to the content mentioned above. FIG. 17 schematically illustrates a method for assembling the light emitting module, the driving module, and the light conversion module according to some embodiments of the present disclosure. As shown in FIG. 1 and FIG. 17, in the step S18 of some embodiments of the present disclosure, the light emitting module 12 and the driving module 16 may be optionally assembled first to form an assembly 96, for example, through the alignment mark M21 and the alignment mark M22. In some embodiments, before assembling the light conversion module 14 to the assembly 96, the assembly 96 may be optionally inspected. Then, as shown in FIG. 14, the light conversion module 14 may be assembled on the assembly 96 by the adhesive layer 88 through the alignment mark M11 and the alignment mark M12 to form the display assembly 18.

Figure 18:
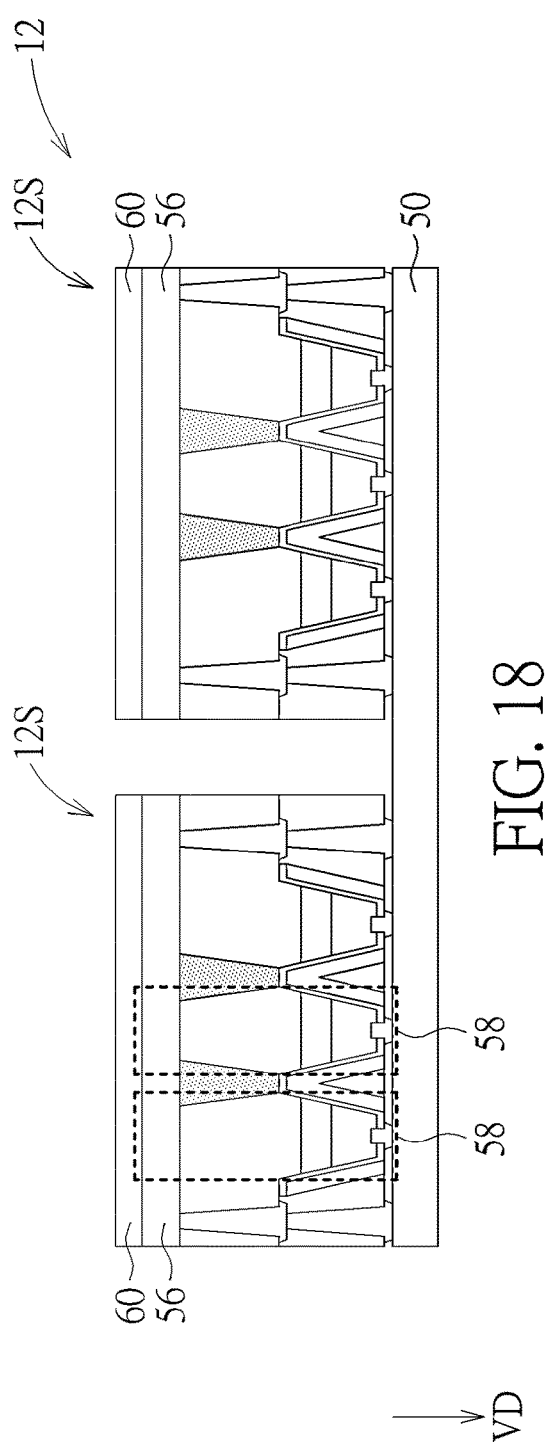
FIG. 18 to FIG. 21 schematically illustrate the method for assembling the light emitting module, the driving module, and the light conversion module according to some embodiments of the present disclosure.

FIG. 18 to FIG. 21 schematically illustrate the method for assembling the light emitting module, the driving module, and the light conversion module according to some embodiments of the present disclosure. In some embodiments, the light emitting module 12 and the light conversion module 14 (or the light conversion assembly 140 including the light blocking pattern 64) may have different sizes. Therefore, at least one of the light emitting module 12 and the light conversion module 14 may be cut before being assembled. Specifically, as shown in FIG. 18, after the light emitting module 12 is formed, the light emitting module 12 may be cut into at least one sub-light emitting module 12S having a specific size. In the embodiment of FIG. 18, the light emitting module 12 may be cut into a plurality of sub-light emitting modules 12S. The sub-light emitting modules 12S may have the same or different sizes, for example. In some embodiments, the sub-light emitting module 12S may include at least two light emitting units 58, wherein the at least two light emitting units 58 may share the same transparent conductive layer 56 and serve as a light source of the sub-pixels, but not limited thereto. In some embodiments, before assembling the sub-light emitting module 12S, the sub-light emitting module 12S may be inspected, but not limited thereto.

Figure 19:
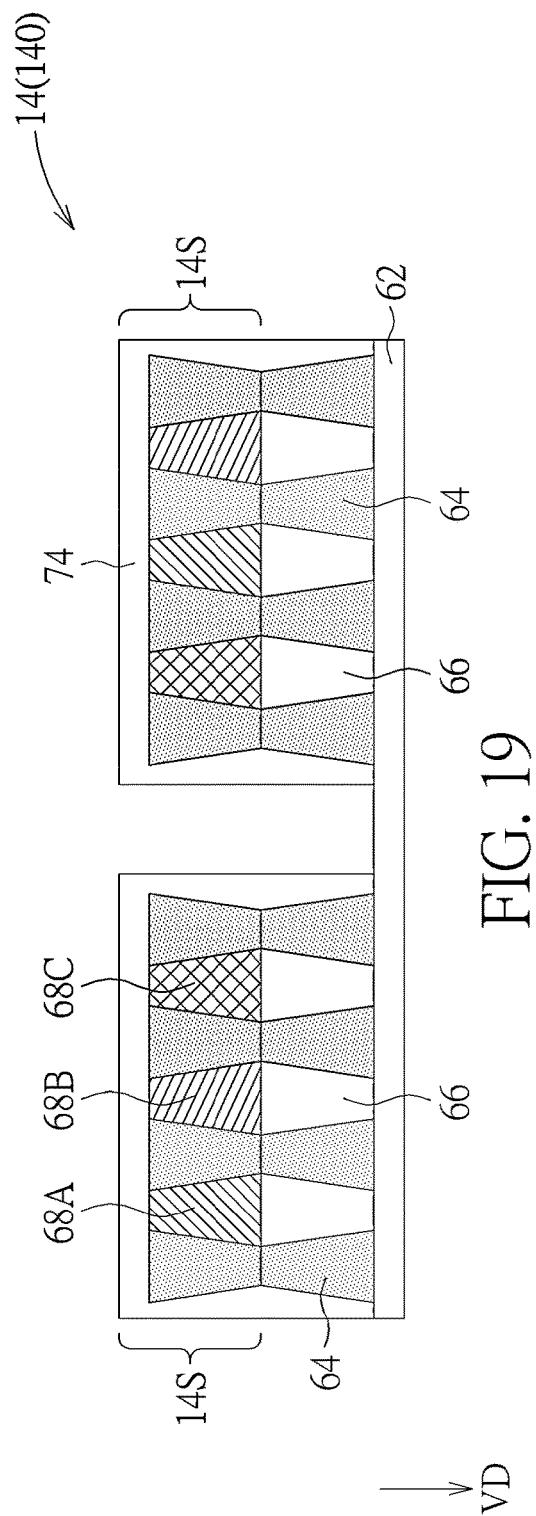

As shown in FIG. 19, after the light conversion module 14 is formed, the light conversion module 14 (or the light conversion assembly 140) may be cut into at least one sub-light conversion module 14S has the same size as the sub light emitting module 12S. In the embodiment of FIG. 19, the light conversion module 14 (or the light conversion assembly 140) may be cut into a plurality of sub-light conversion modules 14S. The sub-light conversion modules 14S may have the same or different sizes, for example. In some embodiments, the sub-light conversion module 14S may include at least two light conversion layers (e.g., at least two of the first light conversion layer 68A, the second light conversion layer 68B, and the third light conversion layer 68C), respectively corresponding to the light emitting units, but not limited thereto. In some embodiments, before assembling the sub-light conversion module 14S, the sub-light conversion module 14S may be inspected, but not limited thereto.

Figure 20:
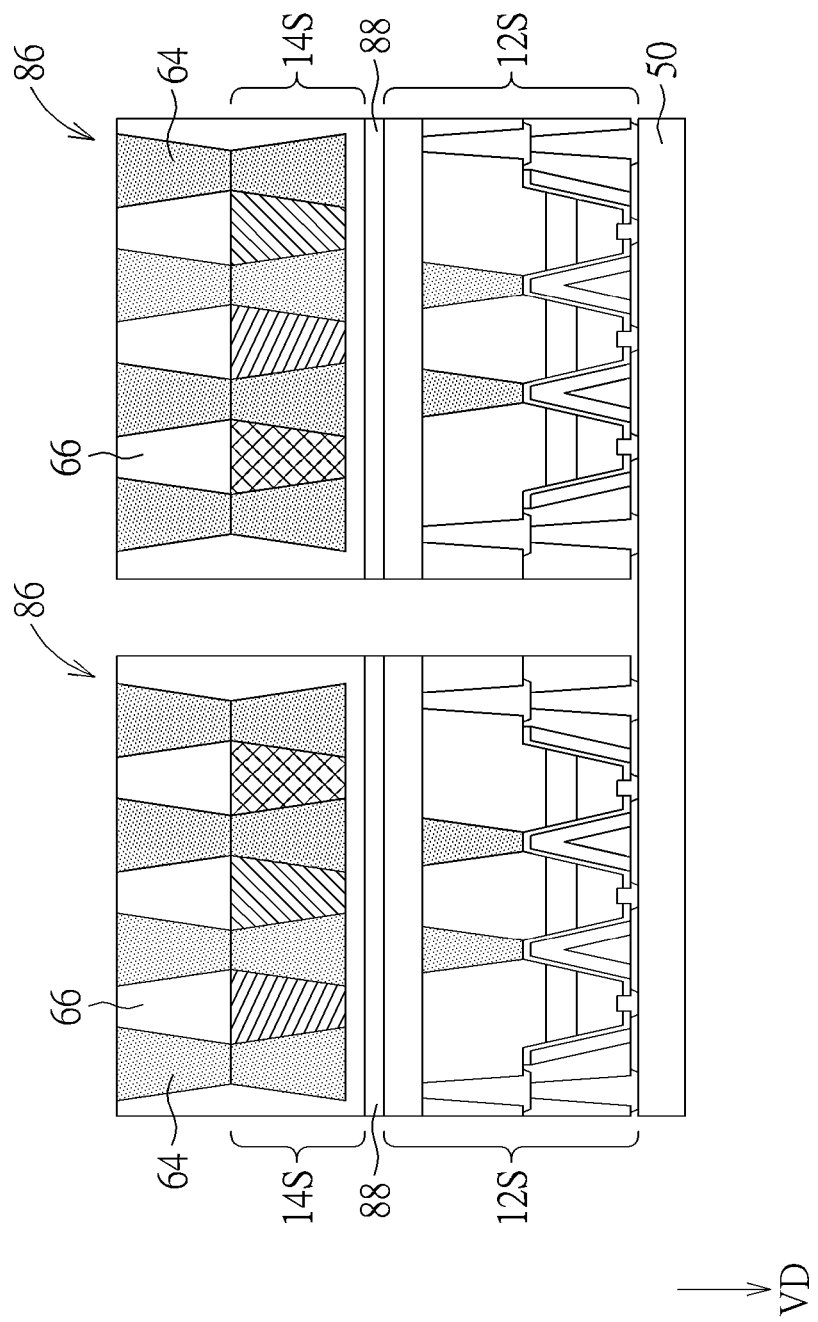

Then, as shown in FIG. 20, the at least one sub-light conversion module 14S may be respectively assembled on the corresponding sub-light conversion module 14 by the adhesive layer 88 to form one or more assemblies 86 on the carrier 50. In some embodiments, when the size of the light emitting module 12 is less than or equal to the size of the sub-light conversion module 14S, the light emitting module 12 may not be cut into the sub-light emitting module 12S and may be directly attached to the sub-light conversion module 14S. Alternatively, when the size of the light conversion module 14 is less than or equal to the size of the light emitting module 12, the light conversion module 14 may not be cut into the sub-light conversion module 14S and may be directly attached to the sub-light emitting module 12S.

Figure 21:
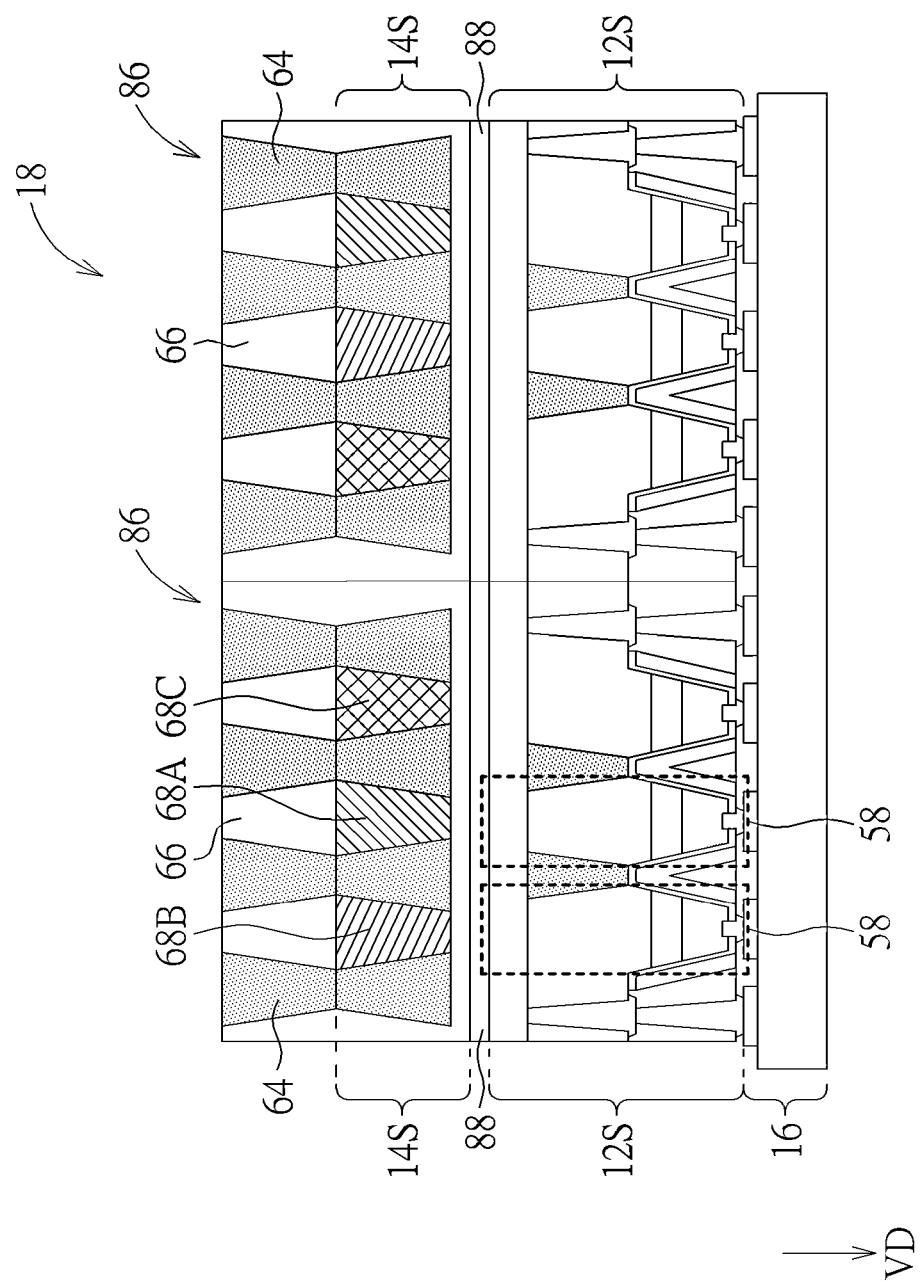

As shown in FIG. 21, one or more assemblies 86 may be assembled on the driving module 16 by conductive glue or other conductive bonding materials to form the display assembly 18. According to the size of the driving module 16, the number of assemblies 86 assembled on the driving module 16 may be determined. In the embodiment of FIG. 21, the size of the driving module 16 may be greater than the size of the sub-light emitting module 12S, so that plural assemblies 86 may be assembled on the driving module 16 by a tiling manner. In some embodiments, when the size of the driving module 16 is less than the size of the sub-light emitting module 12S, one of the sub-light emitting modules 12S may be assembled on plural driving modules 16, but not limited thereto.

In some embodiments, the light emitting module 12 or the sub-light emitting module 12S may be assembled on the driving module 16 through the alignment of one alignment mark group, and then the light conversion module 14 or the sub-light conversion module 14S may be assembled on the light emitting module 12 or the sub-light emitting module 12S through the alignment of another alignment mark group to form the display assembly 18. In such case, before assembling the light conversion module 14 or the sub-light conversion module 14S on the light emitting module 12 or the sub-light emitting module 12S, the assembly of the light emitting module 12 and the driving module 16 or the assembly of the sub-light emitting module 12S and the driving module 16 may be optionally inspected. Then, after the light conversion module 14 or the sub-light conversion module 14S is assembled on the light emitting module 12 or the sub-light emitting module 12S, the display assembly 18 may be optionally inspected.

For example, the driving module 16 may be manufactured on a 12-inch silicon wafer, and the light emitting module 12 may be manufactured on a 6-inch semiconductor wafer, so that two 6-inch light emitting modules 12 may be directly side by side attached on the 12-inch driving module 16 without cutting. The light conversion module 14 may be manufactured, for example, on a carrier with a size greater than the size of the driving module 16 and the size of the light emitting module 12. Therefore, by cutting the light conversion module 14 into the sub-light conversion module 14S having the same size as the driving module 16, the sub-light conversion module 14S may be assembled on two light emitting modules 12 arranged side by side.

In some embodiments, after the display assembly 18 shown in FIG. 21 is formed, the display assembly 18 may be optionally cut to form a plurality of sub-display assemblies, as described above for the sub-display assembly 94 shown in FIG. 16, but not limited thereto.

FIG. 22 schematically illustrates a top view pattern of the alignment mark groups according to some embodiments of the present disclosure. As shown in FIG. 22, the top view pattern of any one of the above-mentioned alignment mark groups may be, for example, a top view pattern P1, a top view pattern P2, a top view pattern P3, a top view pattern P4, or a top view pattern P5, but not limited thereto. Taking a combination of the alignment mark M11 and the alignment mark M12 of FIG. 14 as an example, the alignment mark M11 and the alignment mark M12 may respectively be one and another one of the alignment mark M2 and the alignment mark M1 in the top view pattern P1, the top view pattern P2, the top view pattern P3, the top view pattern P4, or the top view pattern P5 shown in FIG. 22. Taking a combination of the alignment mark M21 and the alignment mark M22 of FIG. 14 as an example, the alignment mark M21 and the alignment mark M22 may respectively be one and another one of the alignment mark M2 and the alignment mark M1 in the top view pattern P1, the top view pattern P2, the top view pattern P3, the top view pattern P4, or the top view pattern P5 shown in FIG. 22. In some embodiments, the above-mentioned alignment mark groups may have other top view patterns.

In the top view pattern P1, the top view pattern P2, the top view pattern P3, the top view pattern P4, and the top view pattern P5 shown in FIG. 22, the alignment mark M1 may, for example, have a solid pattern, and an outline of the alignment mark M1 may, for example, include a rectangle, a circle, a cross, or other suitable shapes. In the top view pattern P1, the top view pattern P2, and the top view pattern P3 shown in FIG. 22, the alignment mark M2 may, for example, have a through hole MH, such that the alignment mark M2 may surround the alignment mark M1 in the top view direction VD, and the through hole MH may be for aligning the alignment mark M1. For example, the alignment mark M2 may have a ring-shaped top view pattern, such as a rectangular, circular, cross-shaped, or other suitable-shaped patterns. In some embodiments, the alignment mark M1 may be, for example, a through hole pattern of a layer, and the alignment mark M2 may be, for example, a solid pattern without the through hole MH, but not limited thereto.

In the top view pattern P4 and the top view pattern P5 shown in FIG. 22, when the outline of the alignment mark M1 is a cross shape and has four notches MP1, the alignment mark M2 may, for example, include four parts MP2 separated from each other, and in the top view direction VD, corners of the parts MP2 of the alignment mark M2 substantially correspond to or be complementary to the notches MP1 of the alignment mark M1, respectively. For example, the parts MP2 may include a right triangle or an L shape.

Figure 25:
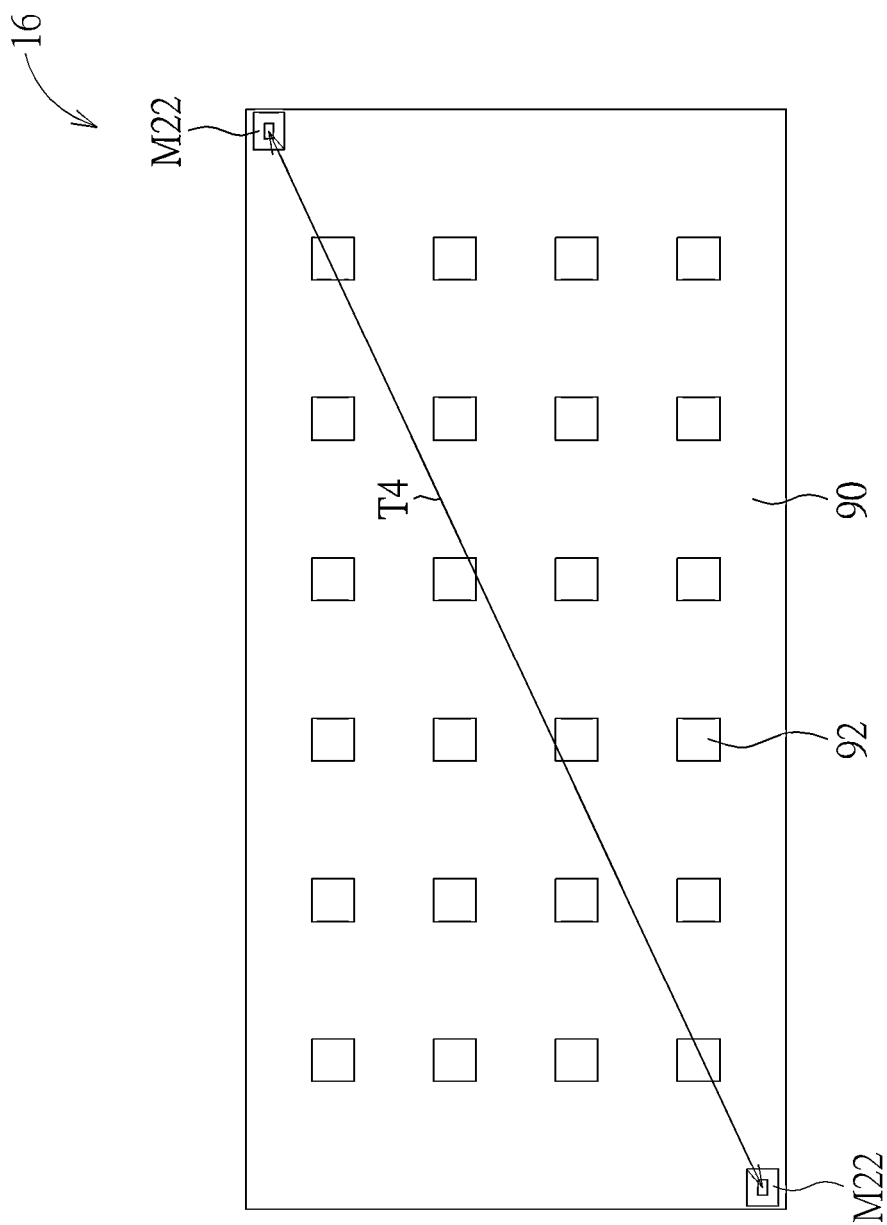

FIG. 23 to FIG. 25 schematically illustrate top views of the light emitting module, the driving module, and the light conversion module according to some embodiments of the present disclosure. As shown in FIG. 23, the light conversion module 14 of some embodiments may include at least two alignment marks M11. For example, the alignment marks M11 may be respectively located at two corners of the light conversion module 14 that are not adjacent to each other. As shown in FIG. 24, the light emitting module 12 of some embodiments may include at least two alignment marks M12. For example, the alignment marks M12 may be respectively located at two corners of the light emitting module 12 that are not adjacent to each other, and in the top view direction VD, the alignment marks M12 may be located at the corners of the light conversion module 14 corresponding to the alignment marks M11. In addition, the light emitting module 12 may further include at least two alignment marks M21. The alignment marks M21 may be respectively located at two corners of the light emitting module 12 that are not adjacent to each other, for example. The corners corresponding to the alignment mark M21 may be different from or the same as the corners corresponding to the alignment mark M12. As shown in FIG. 25, the driving module 16 of some embodiments may include at least two alignment marks M22. For example, the alignment marks M22 may be respectively located at two corners of the driving module 16 that are not adjacent to each other. It should be noted that the processes of manufacturing the light emitting module 12, the driving module 16 and the light conversion module 14 may respectively include thermal processes, resulting in different degrees of expansion or contraction. Therefore, in order to reduce misalignment during assembling, a ratio of a distance T1 between the alignment marks M11 to a distance T2 between the alignment marks M12 may be, for example, 0.8 to 1.2, or 0.9 to 1.1, and a ratio of a distance T3 between the alignment marks M21 to a distance T4 between the alignment marks M22 may be, for example, 0.8 to 1.2, or 0.9 to 1.1. Through controlling the above-mentioned ratios, assembling accuracy may be improved. The distance T1 between the alignment marks (e.g., the alignment marks M11, the alignment marks M12, the alignment marks M21, and the alignment marks M22) may be, for example, a distance between center points of the alignment marks.

In summary, in the method for manufacturing the display device of the present disclosure, since the light emitting units as the light source of the sub-pixels are manufactured in the same light emitting module, the distance between the light emitting units may not be limited by the mass-transfer technique, and thus, the display device is able to be formed. In addition, by directly assembling the light emitting module, the light conversion module, and the driving module, the manufacturing difficulty may be reduced, thereby solving the problem that the mass-transfer technique used for manufacturing the display device cannot overcome.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing a display device, comprising:
    providing a light emitting module;
    providing a driving module;
    providing a light conversion module; and
    assembling the light emitting module, the driving module and the light conversion module to form a display assembly, wherein the light emitting module is disposed between the light conversion module and the driving module, and the light emitting module and the driving module are assembled with each other after the light emitting module and the driving module are formed separately.

2. The method of claim 1, further comprising:
    providing a light collimating module; and
    assembling the light collimating module on the display assembly.

3. The method of claim 1, further comprising:
    providing a light blocking layer on the light conversion module; and
    patterning the light blocking layer to form a first light passing through hole.

4. The method of claim 1, wherein the light conversion module comprises a second passing through hole.

5. The method of claim 1, further comprising:
    cutting the display assembly to form a plurality of sub-display assemblies.

6. The method of claim 1, wherein the light emitting module comprises a light emitting unit and a third light passing through hole, and the third light passing through hole is disposed corresponding to the light emitting unit.

7. The method of claim 1, wherein the driving module comprises a single crystal semiconductor substrate.

8. The method of claim 1, wherein providing the light emitting module comprises forming a first semiconductor layer, a light emitting layer, and a second semiconductor layer sequentially stacked and performing a patterning process on the first semiconductor layer, the light emitting layer and the second semiconductor layer to form a plurality of light emitting diode islands.

* * * * *